(12) United States Patent
Somani et al.

(10) Patent No.: US 9,278,303 B1
(45) Date of Patent: Mar. 8, 2016

(54) MANAGING DATA CENTER AIRFLOW

(75) Inventors: Ankit Somani, Sunnyvale, CA (US); Christopher G Malone, Mountain View, CA (US)

(73) Assignee: Google Inc., Mountain View, CA (US)

( * ) Notice: Subject to any disclaimer, the term of this patent is extended or adjusted under 35 U.S.C. 154(b) by 33 days.

(21) Appl. No.: 13/482,779

(22) Filed: May 29, 2012

(51) Int. Cl.
| F24F 3/14 | (2006.01) |
| B01D 47/06 | (2006.01) |
| F24F 3/147 | (2006.01) |
| F24F 6/14 | (2006.01) |
| H05K 7/20 | (2006.01) |

(52) U.S. Cl.
CPC . *B01D 47/06* (2013.01); *F24F 3/14* (2013.01); *F24F 3/147* (2013.01); *F24F 6/14* (2013.01); *H05K 7/20009* (2013.01); *H05K 7/20745* (2013.01)

(58) Field of Classification Search
CPC ........... F24F 3/14; F24F 3/147; F24F 5/0035; F24F 6/14; F24F 6/18; F28C 3/06; B01D 47/06
USPC ......... 62/91, 97, 121, 171, 178, 259.5, 259.4, 62/304; 361/688, 690, 691, 694; 261/127, 261/128, 129
See application file for complete search history.

(56) References Cited

U.S. PATENT DOCUMENTS

| 2,144,693 | A | * | 1/1939 | Seid ............................. 236/44 C |
| 3,963,461 | A | * | 6/1976 | Stockford et al. ................. 95/10 |
| 4,313,310 | A | | 2/1982 | Kobayashi et al. |
| 4,380,910 | A | | 4/1983 | Hood et al. |
| 4,474,027 | A | | 10/1984 | Kaya et al. |
| 4,526,011 | A | | 7/1985 | Logan et al. |
| 5,531,800 | A | * | 7/1996 | Sewell ................... B01D 47/06 96/240 |

(Continued)

FOREIGN PATENT DOCUMENTS

CN          1546911 A    11/2004

OTHER PUBLICATIONS

C. Mike Scofield, et al., "Data Center Cooling: Using Wet-Bulb Economizers" ASHRAE Journal, Aug. 2008, pp. 52-58.

(Continued)

*Primary Examiner* — Mohammad M Ali
*Assistant Examiner* — Christopher R Zerphey
(74) *Attorney, Agent, or Firm* — Fish & Richardson P.C.

(57) ABSTRACT

Techniques for treating an outside airflow with a direct evaporative economizer include circulating an airflow from an ambient environment into a direct evaporative economizer; circulating a cooling fluid into the direct evaporative economizer at a first rate so that a temperature condition of a supply airflow meets a predetermined range of setpoint temperatures; evaporating at least a portion of the cooling fluid circulated at the first rate into the airflow; determining that a measured air contaminant level of the airflow is greater than a setpoint contaminant level; and based on the determination, circulating the cooling fluid into the direct evaporative economizer at a second rate to precipitate a plurality of contaminants from the airflow into the cooling fluid, the second flow rate of the cooling fluid operable to adjust the temperature condition of the supply airflow outside of the predetermined range of setpoint temperatures of the supply airflow.

27 Claims, 20 Drawing Sheets

(56) References Cited

U.S. PATENT DOCUMENTS

| | | | | |
|---|---|---|---|---|
| 5,555,742 | A * | 9/1996 | Kelley | 62/311 |
| 5,695,117 | A * | 12/1997 | Sizemore et al. | 236/44 A |
| 5,884,492 | A * | 3/1999 | Zwicky et al. | 62/91 |
| 6,059,866 | A * | 5/2000 | Yamagata et al. | 96/251 |
| 6,282,915 | B1 | 9/2001 | Egbert | |
| 6,345,515 | B1 * | 2/2002 | Pautsch et al. | 62/311 |
| 6,387,165 | B1 * | 5/2002 | Wakamatsu | 96/270 |
| 6,412,292 | B2 | 7/2002 | Spinazzola et al. | |
| 7,219,714 | B1 | 5/2007 | Heydari | |
| 7,864,530 | B1 | 1/2011 | Hamburgen et al. | |
| 2002/0014460 | A1 * | 2/2002 | McKay | 210/696 |
| 2003/0173688 | A1 | 9/2003 | Koo | |
| 2004/0013563 | A1 * | 1/2004 | Romer et al. | 422/28 |
| 2004/0020224 | A1 | 2/2004 | Bash et al. | |
| 2004/0206101 | A1 | 10/2004 | Bash et al. | |
| 2004/0231512 | A1 * | 11/2004 | Slayzak et al. | 95/211 |
| 2005/0103032 | A1 | 5/2005 | Pierson | |
| 2006/0065000 | A1 | 3/2006 | Belady | |
| 2007/0130969 | A1 * | 6/2007 | Peterson et al. | 62/178 |
| 2007/0183126 | A1 | 8/2007 | Tilton et al. | |
| 2008/0029250 | A1 * | 2/2008 | Carlson et al. | 165/104.33 |
| 2009/0201645 | A1 | 8/2009 | Kashirajima et al. | |
| 2009/0310300 | A1 | 12/2009 | Chrysler | |
| 2010/0154448 | A1 | 6/2010 | Hay | |
| 2011/0195652 | A1 * | 8/2011 | Smith | 454/184 |

OTHER PUBLICATIONS

Lawrence Berkeley National Laboratory et al., "Data Center Economizer Contamination and Humidity Study" Pacific Gas and Electric Company Emerging Technologies Program Application Assessment Report, Mar. 13, 2007 (40 pages).

Marc A. Hoeschele, "Residential Indirect/Direct Evaporative Cooler Performance in Sacramento" Davis Energy Group, Inc. (11 pages).

Wescor, "Evaporative Cooling Basics" www.wescorhvac.com/Evaporative_cooling_white_paper.htm, last visited May 29, 2012 (9 pages).

Energy Design Resources, "e-News #71: Evaporative Cooling: Saving Energy in More Ways Than Ever" energydesignresources.com/ . . . /e-news-71-evaporative-cooling-saving-energy, last visited May 29, 2012 (4 pages).

Reliant Energy "HVAC: Evaporative Cooling" reliant.com/ . . . /esc_purchasing_advisor_evaporative_cooling_bus_gen.jsp, 2004, last visited May 29, 2012 (4 pages).

Facebook Prineville Data Center, "Environmental Practices", (Jan. 11, 2010) [retrieved on Jul. 18, 2011]. Retrieved from: <URL: http://www.facebook.com/note.php?note_id=242308668132>, 2 pages.

Open Compute Project, "Data Centers", (Apr. 7, 2011) [retrieved on Jul. 18, 2011]. Retrieved from: <URL: http://opencompute.org/datacenters/>, 42 pages.

* cited by examiner

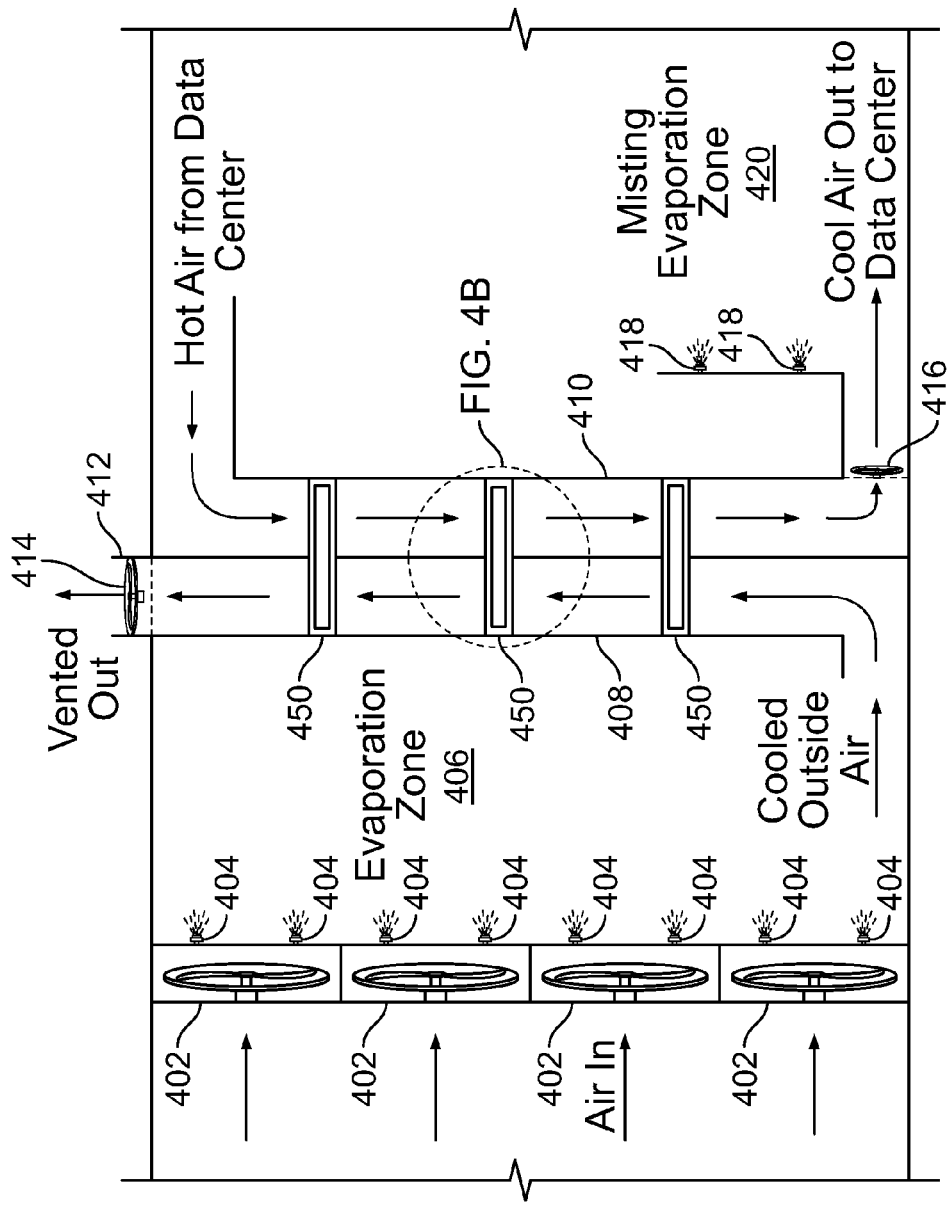

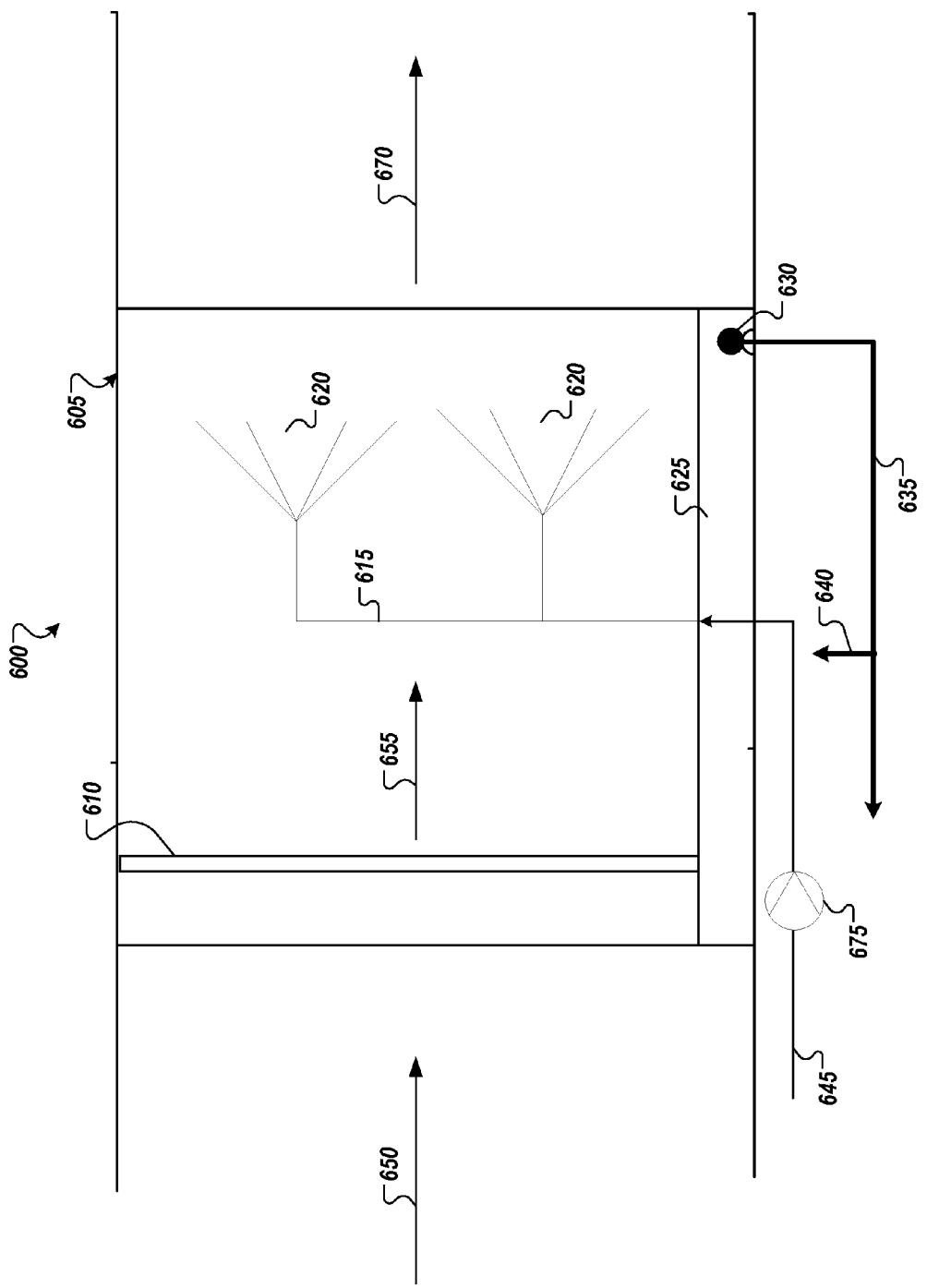

MANAGING DATA CENTER AIRFLOW

TECHNICAL BACKGROUND

This disclosure relates to systems and methods for managing airflow to areas that contain electronic equipment, such as computer server rooms and server racks in computer data centers.

BACKGROUND

Computer users often focus on the speed of computer microprocessors (e.g., megahertz and gigahertz). Many forget that this speed often comes with a cost—higher power consumption. For one or two home PCs, this extra power may be negligible when compared to the cost to run the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. It is much like having a room filled with thousands of burning floodlights. The effects of power consumed by the critical load in the data center are often compounded when one incorporates all of the ancillary equipment required to support the critical load.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in temperature can cause great increases in microprocessor errors and failures. In sum, a data center requires a large amount of electricity to power the critical load, and even more electricity to cool the load.

Air side economization based data center cooling can increase energy-efficiency by more cost-effectively cooling the electronics without mechanical cooling. But air side economization also may have an inherent risk of introducing outside air into a relatively clean space. The outside air can carry dust, moisture, and other contaminants at best during normal outside environmental conditions. At worst, outside environmental conditions may include contaminants (e.g., ash, chemicals, biologic material, exhaust from hydrocarbon powered generators, $NO_x$ gases) from disasters, such as fires, chemical spills, airborne terrorist attacks, or other calamities. The introduction of such hazards into a cooling airflow can affect server reliability, performance, and life.

SUMMARY

This disclosure relates to systems and methods for cooling a data center with an air handling system operable in two or more modes of operation. For instance, in some implementations, the air handling system may be operable in a first mode in which an outside airflow is circulated through a direct evaporative economizer module of the air handling system to cool the outside airflow. The cooled outside airflow is circulated to the data center to remove heat from the data center, such as, heat generated by computing devices operating in the data center. The air handling system may be operable in a second mode in which a return airflow is circulated through an indirect evaporative cooling module of the air handling system to cool the return airflow. The cooled return airflow is circulated to the data center to remove heat from the data center. The air handling system may switch from the first mode to the second mode based on, for instance, an unacceptable amount of contaminants detected in the outside airflow. For example, a third mode may include cooling an outside airflow with the indirect evaporative cooling module and then further cooling the airflow with the direct evaporative cooling module before supplying the cooled airflow to the data center. A fourth mode may include circulating outside airflow to the data center without conditioning the outside airflow. A fifth mode may include cooling an outside airflow with the direct evaporative cooling module and mixing the cooled airflow with a return airflow before circulating the mixed airflow to the data center.

In some example implementations, the direct evaporative cooling module may help clean an airflow, such as an outside airflow, by precipitating out contaminants from the airflow with a cooling fluid supplied to the direct evaporative cooling module. In some implementations, a rate of the cooling fluid supplied to the direct evaporative cooling module may be adjusted (e.g., increased) based on a detection of contaminants in the outside airflow. In some implementations, the rate of the cooling fluid may be adjusted from a first rate operable to meet a supply air setpoint range to a second rate in which the supply air is outside of the setpoint range.

In one general implementation, a method for treating an outside airflow with a direct evaporative economizer includes: circulating an outside airflow from an ambient environment into a direct evaporative economizer module of an air handling system; circulating a cooling fluid into the direct evaporative economizer module at a first rate so that a temperature condition of a supply airflow circulated from the air handling system to a data center meets a predetermined range of setpoint temperatures of the supply airflow; evaporating at least a portion of the cooling fluid circulated at the first rate into the outside airflow; determining that a measured air contaminant level of the outside airflow is greater than a setpoint contaminant level of the outside airflow; and based on the determination, circulating the cooling fluid into the direct evaporative economizer module at a second rate to precipitate a plurality of contaminants from the outside airflow into the cooling fluid, the second flow rate of the cooling fluid operable to adjust the temperature condition of the supply airflow outside of the predetermined range of setpoint temperatures of the supply airflow.

A first aspect combinable with the general implementation further includes monitoring the temperature condition of the supply airflow.

A second aspect combinable with any of the previous aspects further includes adjusting the first rate of cooling fluid circulated to the direct evaporative cooling module based on the monitored temperature condition outside of the predetermined range of setpoint temperatures of the supply airflow.

In a third aspect combinable with any of the previous aspects, circulating a cooling fluid into the direct evaporative economizer includes circulating the cooling fluid over a media of the direct evaporative cooling module.

In a fourth aspect combinable with any of the previous aspects, circulating a cooling fluid into the direct evaporative economizer includes: atomizing the cooling fluid; and spraying the atomized cooling fluid into the outside airflow.

A fifth aspect combinable with any of the previous aspects further includes capturing at least a portion of the cooling fluid not evaporated into the outside airflow in a sump of the direct evaporative cooling module.

A sixth aspect combinable with any of the previous aspects further includes circulating some of the captured portion of the cooling fluid to a drainage system.

A seventh aspect combinable with any of the previous aspects further includes circulating some of the captured portion of the cooling fluid to a fluid treatment system.

An eighth aspect combinable with any of the previous aspects further includes filtering the captured portion of the cooling fluid through the fluid treatment system to remove at least a portion of the precipitated contaminants.

A ninth aspect combinable with any of the previous aspects further includes recirculating the filtered cooling fluid back to the direct evaporative cooling module.

In a tenth aspect combinable with any of the previous aspects, the cooling fluid is one of deionized water; or reverse osmosis water.

In an eleventh aspect combinable with any of the previous aspects, the cooling fluid further includes chlorine dioxide.

In another general implementation, an air handling system includes an outside air plenum; a supply fan in airflow communication with the outside air plenum; a direct evaporative economizer module arranged in fluid communication with the outside air plenum and the supply fan. The direct evaporative economizer module includes: an airflow path; at least one nozzle arranged in the airflow path and configured to release a cooling fluid into an outside airflow in the airflow path; and a pump configured to supply the cooling fluid to the nozzle. The system includes a control system configured to control the pump so that the cooling fluid is released into the outside airflow at a first flow rate to meet a predetermined range of setpoint temperatures of a supply airflow circulated from the supply fan.

In a first aspect combinable with the general implementation, the control system is further configured to control the pump so that the cooling fluid is released into the outside airflow at a second flow rate based on a measured air contaminant level of the outside airflow greater than a setpoint contaminant level of the outside airflow, where the airflow temperature is outside of the predetermined range of setpoint temperatures of the supply airflow when the cooling fluid is released into the outside airflow at the second flow rate.

In a second aspect combinable with any of the previous aspects, the control system is further configured to: monitor a condition of the supply airflow.

In a third aspect combinable with any of the previous aspects, control the pump to adjust the first flow rate of cooling fluid released into the outside airflow based on the monitored condition outside of the predetermined range of setpoint temperatures of the supply airflow.

In a fourth aspect combinable with any of the previous aspects, the control system is further configured to control the pump to circulate the cooling fluid over a media of the direct evaporative economizer module.

In a fifth aspect combinable with any of the previous aspects, the at least one nozzle is further configured to atomize the cooling fluid; and spray the atomized cooling fluid into the outside airflow in the airflow path.

In a sixth aspect combinable with any of the previous aspects, the direct evaporative economizer module further includes a sump positioned to capture at least a portion of the cooling fluid not evaporated into the outside airflow.

In a seventh aspect combinable with any of the previous aspects, the direct evaporative economizer module further includes a second pump configured to circulate some of the captured portion of the cooling fluid to a drainage system.

In an eighth aspect combinable with any of the previous aspects, the second pump is configured to circulate some of the captured portion of the cooling fluid to a fluid treatment system to be filtered to remove at least a portion of precipitated contaminants contained in the cooling fluid.

In a ninth aspect combinable with any of the previous aspects, the second pump is configured to recirculate the filtered cooling fluid back to the direct evaporative economizer module.

In a tenth aspect combinable with any of the previous aspects, the cooling fluid is one of deionized water; or reverse osmosis water.

In an eleventh aspect combinable with any of the previous aspects, the cooling fluid further includes chlorine dioxide.

In another general implementation, a direct evaporative economizer apparatus for an air handling system includes an inlet in airflow communication with an outside air plenum; an outlet in airflow communication with a supply fan; an airflow path defined between the inlet and the outlet; a conduit arranged adjacent the airflow path to release a cooling fluid into the airflow in the airflow path; and a control system configured to control the release of the cooling fluid into the airflow at a first flow rate to meet a predetermined range of setpoint temperatures of a supply airflow circulated from the outlet.

In a first aspect combinable with the general implementation, the control system is further configured to control the release of the cooling fluid into the airflow at a second flow rate based on a measured air contaminant level of the airflow greater than a setpoint contaminant level of the airflow, where the airflow temperature is outside of the predetermined range of setpoint temperatures of the supply airflow when the cooling fluid is released into the airflow at the second flow rate.

In a second aspect combinable with any of the previous aspects, the control system is further configured to monitor a temperature condition of the supply airflow; and control a pump configured to circulate the cooling fluid to the conduit to adjust the first flow rate of cooling fluid released into the airflow based on the monitored temperature condition outside of the predetermined range of setpoint temperatures of the supply airflow.

In a third aspect combinable with any of the previous aspects, the control system is further configured to control the pump to circulate the cooling fluid over a media of the direct evaporative economizer module.

In a fourth aspect combinable with any of the previous aspects, the conduit comprises a mister configured to atomize the cooling fluid; and spray the atomized cooling fluid into the airflow in the airflow path.

A fifth aspect combinable with any of the previous aspects further includes a sump positioned to capture at least a portion of the cooling fluid not evaporated into the airflow; and a pump configured to circulate some of the captured portion of the cooling fluid to a drainage system.

In a sixth aspect combinable with any of the previous aspects, the pump is configured to circulate some of the captured portion of the cooling fluid to a fluid treatment system to be filtered to remove at least a portion of precipitated contaminants contained in the cooling fluid; and recirculate the filtered cooling fluid back to the mister.

In a seventh aspect combinable with any of the previous aspects, the cooling fluid is one of deionized water; or reverse osmosis water.

In an eighth aspect combinable with any of the previous aspects, the cooling fluid further includes chlorine dioxide.

A ninth aspect combinable with any of the previous aspects further includes a wettable media arranged in the airflow path between the inlet and the outlet, wherein the mister is positioned in the airflow path to release the cooling fluid over at least a portion of the wettable media.

Various implementations of systems and methods for providing cooling to areas containing electronic equipment may include one or more of the following benefits. Inherent risks associated with using outside air for data center cooling, such as supply air contamination, are mitigated without employing expensive mechanical cooling techniques. Further, providing an air handling system that is operable to implement multiple modes of supply air cooling based on environmental conditions may increase the overall energy efficiency of a data center. Further still, certain airflow modes may provide a reduction of water usage as compared to other modes or other cooling techniques in general. This reduction of water usage means that less power is consumed by the air handling system, increasing its energy efficiency. Further, the reduction of water usage may make the air handling system operate in a more environmentally-friendly manner and with less impact on site resources.

These general and specific aspects may be implemented using a device, system or method, or any combinations of devices, systems, or methods. The details of one or more implementations are set forth in the accompanying drawings and the description below. Other features, objects, and advantages will be apparent from the description and drawings, and from the claims.

DESCRIPTION OF DRAWINGS

FIGS. 4A-4B are magnified views of the air-to-air heat wheel heat exchangers;

FIGS. 6A-6C illustrate example implementations of one or more direct economizer modules for cooling a computer data center with an air handling system;

DETAILED DESCRIPTION

This disclosure relates to systems and methods for cooling a data center with an air handling system operable in two or more modes of operation. For instance, in some implementations, the air handling system may be operable in a first mode in which an outside airflow is circulated through a direct evaporative economizer module of the air handling system to cool the outside airflow. The cooled outside airflow is circulated to the data center to remove heat from the data center, such as, heat generated by computing devices operating in the data center. The air handling system may be operable in a second mode in which a return airflow is circulated through an indirect evaporative cooling module of the air handling system to cool the return airflow. The cooled return airflow is circulated to the data center to remove heat from the data center. The air handling system may switch from the first mode to the second mode based on, for instance, an unacceptable amount of contaminants detected in the outside airflow. For example, a third mode may include cooling an outside airflow with the indirect evaporative cooling module and then further cooling the airflow with the direct evaporative cooling module before supplying the cooled airflow to the data center. A fourth mode may include circulating outside airflow to the data center without conditioning the outside airflow. A fifth mode may include cooling an outside airflow with the direct evaporative cooling module and mixing the cooled airflow with a return airflow before circulating the mixed airflow to the data center.

In some example implementations, the direct evaporative cooling module may help clean an airflow, such as an outside airflow, by precipitating out contaminants from the airflow with a cooling fluid supplied to the direct evaporative cooling module. In some implementations, a rate of the cooling fluid supplied to the direct evaporative cooling module may be adjusted (e.g., increased) based on a detection of contaminants in the outside airflow. In some implementations, the rate of the cooling fluid may be adjusted from a first rate operable to meet a supply air setpoint range to a second rate in which the supply air is outside of the setpoint range.

Figure 1A:
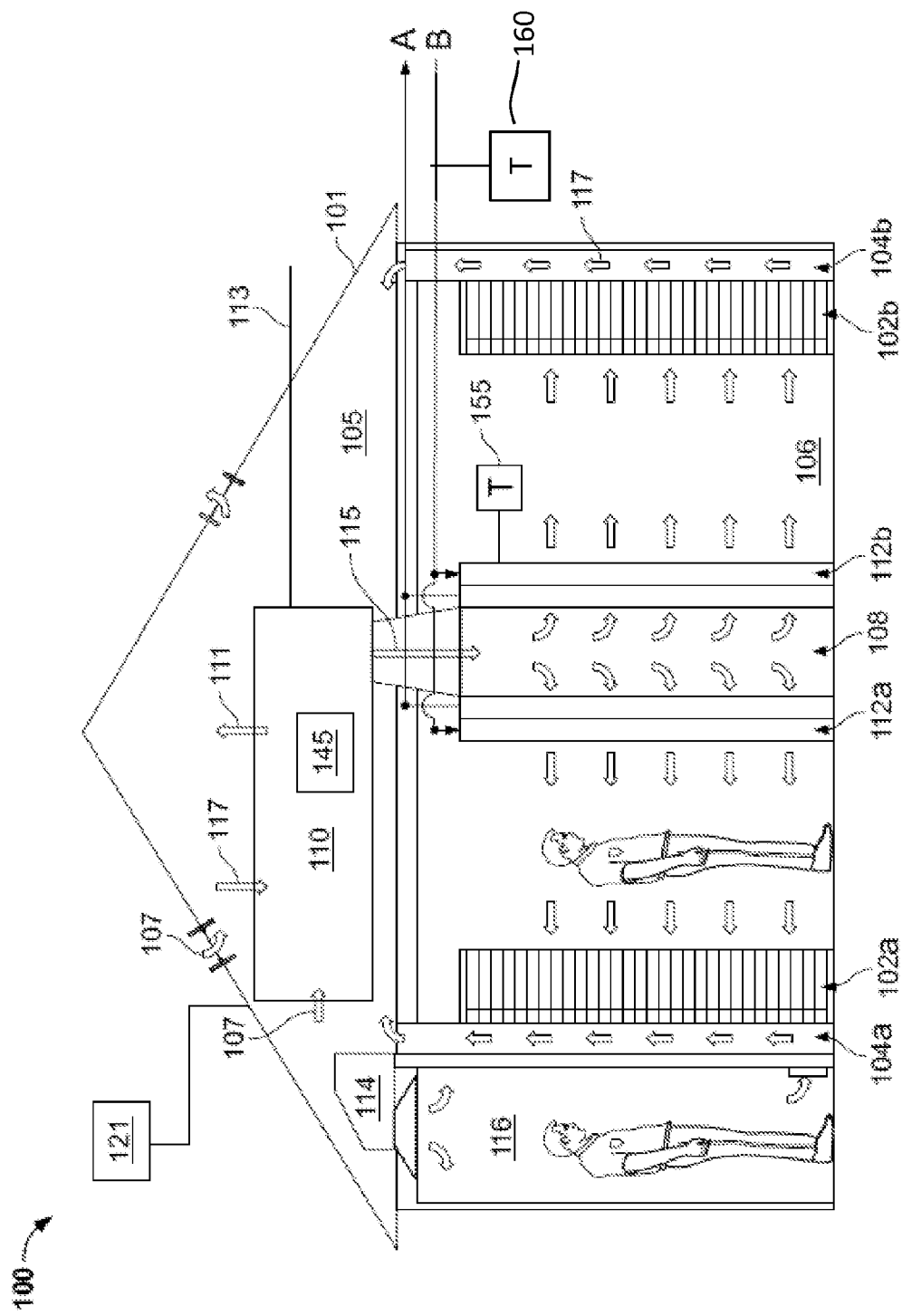
FIGS. 1A-1B illustrate an example implementation of a system for cooling a computer data center with an air handling system operable in multiple airflow modes.
Figure 1B:
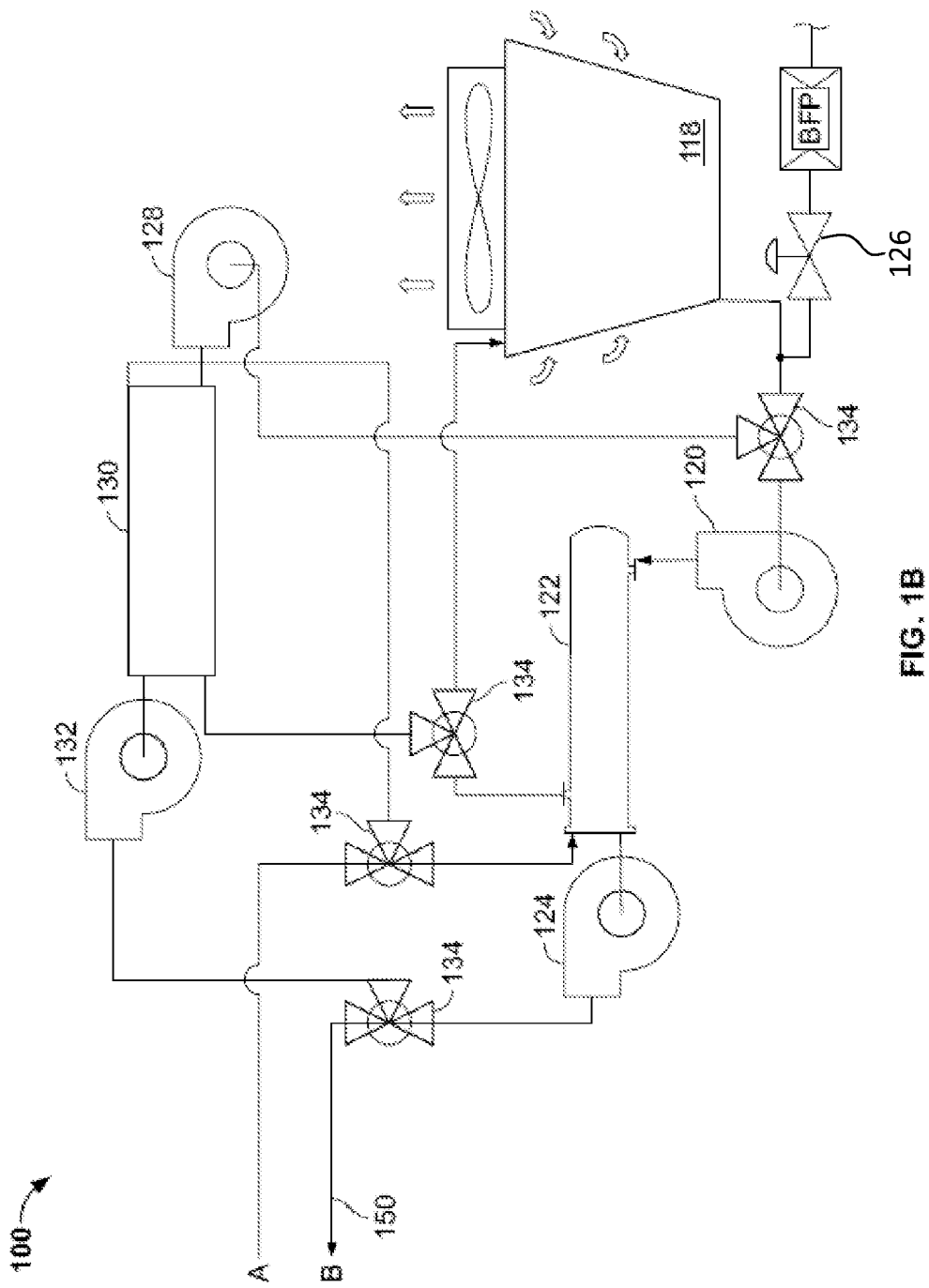

FIGS. 1A-1B illustrate an example implementation of a system 100 for cooling a computer data center 101 with an air handling system 110 operable in multiple airflow modes. The air handling system 110 can be placed in an enclosed space within the computer data center 101 (e.g., a ceiling area, an attic, a raised floor or a basement), or in an open space outside the data center (e.g., on the rooftop or side of the data center). Further, the illustrated air handling system 110 can be constructed as a packaged air handling unit, a modular built-up system, or a field constructed system, to name a few examples. Further, although the components of the air handling system 110 are shown back-to-back, they may be separated by, for example, ductwork or other air circulating conduit, without departing from the scope of the disclosure.

A workspace 106 is defined around the computers, which are arranged in a number of parallel rows and mounted in vertical racks, such as racks 102a, 102b. The racks may include pairs of vertical rails to which are attached paired mounting brackets (not shown). Trays containing computers, such as standard circuit boards in the form of motherboards, may be placed on the mounting brackets.

As illustrated, the air handling system 110 receives an outside airflow 107 and a return airflow 117 and expels an exhaust airflow 111. The air handling system 110 also circulates a supply airflow 115 to the data center 101, for example, through coils 112a, 112b. As further illustrated, the example air handling system 110 receives a cooling fluid 113 to one or more modules of the air handling system 110, for example a direct evaporative cooling module and/or an indirect evaporative cooling module of the air handling system 110. The cooling fluid 113 may, for instance, be deionized water, RO (reverse osmosis) water, distilled water, or other purified fluid. In some implementations, the air handling system is configured to function according to multiple modes of operation. Each operational mode may provide one or more levels of conditioning (e.g., cooling) for the supply air 115. An appropriate mode of operation may be determined by the air handling system 110 based on various sensor readings and measurements of the outside environment, such that the supply air 115 is appropriately and efficiently conditioned for data center cooling. More specifically, in some modes of operation, as described below with respect to FIGS. 7A-7F, 8, and 9, the controller 145 may operate the air handling system 110 in two or more operational modes based on, for instance, conditions of the outside environment, conditions of one or more airflows (such as outside airflow 107, supply airflow 115, heated airflow 117), conditions of one or more cooling fluids (such as the cooling water 150), and/or conditions of the outside environment.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Supply air 115 may circulate from workspace 106 across the trays and into warm-air plenums 104a, 104b behind the trays. The supply air 115 may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the supply air 115 in the work space 106 is known, controlling the exhaust temperature also indirectly controls the temperature rise. The work space 106 may, in certain circumstances, be referenced as a "cold aisle," and the plenums 104a, 104b as "warm aisles."

The temperature rise can be large. For example, the work space 106 temperature may be about 77° F. (25° C.) and the exhaust temperature into the warm-air plenums 104a, 104b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air 117 may be routed upward into a ceiling area, or attic 105, or into a raised floor or basement, or other appropriate space, and may be gathered there by air handling system 110, which may include, for example, one or more centrifugal fans appropriately sized for the task. The air handling system 110 may then deliver the air back into a plenum 108 located adjacent to the workspace 106. The plenum 108 may be simply a bay-sized area in the middle of a row of racks, that has been left empty of racks, and that has been isolated from any warm-air plenums on either side of it, and from cold-air work space 106 on its other sides. Alternatively, air may be cooled by coils 112a, 112b defining a border of the plenum 108 and expelled directly into workspace 106.

Cooling coils 112a, 112b may be located on opposed sides of the plenum approximately flush with the fronts of the racks. (The racks in the same row as the plenum 108, coming in and out of the page in the figure, are not shown.) The coils may have a large surface area and be very thin so as to present a low pressure drop to the system 100. In this way, slower, smaller, and quieter fans may be used to drive air through the system. Protective structures such as louvers or wire mesh may be placed in front of the coils 112a, 112b to prevent them from being damaged.

In operation, air handling system 110 pushes air down into plenum 108, causing increased pressure in plenum 108 to push air out through cooling coils 112a, 112b. As the air passes through the coils 112a, 112b, its heat is transferred into the water in the coils 112a, 112b, and the air is cooled.

The speed of a fan in the air handling system 110 and/or the flow rate or temperature of a cooling water 150 (or other cooling fluid) flowing in the cooling coils 112a, 112b may be controlled in response to measured values. For example, the pumps driving the cooling liquid may be variable speed pumps that are controlled to maintain a particular temperature in work space 106. Such control mechanisms may be used to maintain a constant temperature in workspace 106 or plenums 104a, 104b and attic 105.

The workspace 106 air may then be drawn into racks 102a, 102b such as by fans mounted on the many trays that are mounted in racks 102a, 102b. This air may be heated as it passes over the trays and through power supplies running the computers on the trays, and may then enter the warm-air plenums 104a, 104b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as air handling system 110 captures and circulates the heated air 117.

Additional items may also be cooled using system 100. For example, room 116 is provided with a self-contained fan-coil unit 114 which contains a fan and a cooling coil. The unit 114 may operate, for example, in response to a thermostat provided in room 116. Room 116 may be, for example, an office or other workspace ancillary to the main portions of the data center 101.

In addition, supplemental cooling may also be provided to room 116 if necessary. For example, a standard roof-top or similar air-conditioning unit (not shown) may be installed to provide particular cooling needs on a spot basis. As one example, system 100 may be designed to deliver 78° F. (25.56° C.) supply air to work space 106, and workers may prefer to have an office in room 116 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 100.

Fresh air may be provided to the workspace 106 by various mechanisms. For example, a supplemental air-conditioning unit (not shown), such as a standard roof-top unit may be provided to supply necessary exchanges of outside air. Also, such a unit may serve to dehumidify the workspace 106 for the limited latent loads in the system 100, such as human perspiration. Alternatively, louvers may be provided from the outside environment to the system 100, such as powered louvers to connect to the warm air plenum 104b. System 100 may be controlled to draw air through the plenums when environmental (outside) ambient humidity and temperature are sufficiently low to permit cooling with outside air. Such louvers may also be ducted to air handling system 110, and warm air in plenums 104a, 104b may simply be exhausted to atmosphere, so that the outside air does not mix with, and get diluted by, the warm air from the computers. Appropriate filtration may also be provided in the system, particularly where outside air is used.

Also, the workspace 106 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 124. The cooling water circuit may be formed as a direct-return, or indirect-return, circuit, and may generally be a closed-loop system. Pump 124 may take any appropriate form, such as a standard centrifugal pump. Heat exchanger 122 may remove heat from the cooling water 150 in the circuit. Heat exchanger 122 may take any appropriate form, such as a plate-and-frame heat exchanger or a shell-and-tube heat exchanger.

Heat may be passed from the cooling water circuit to a condenser water circuit that includes heat exchanger 122, pump 120, and cooling tower 118. Pump 120 may also take any appropriate form, such as a centrifugal pump. Cooling tower 118 may be, for example, one or more forced draft towers or induced draft towers. The cooling tower 118 may be considered a free cooling source, because it requires power only for movement of the water in the system and in some implementations the powering of a fan to cause evaporation; it does not require operation of a compressor in a chiller or similar structure.

The cooling tower 118 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 122, and routing cooling tower water (condenser water) directly to cooling coils 112a, 112b (not shown). Such an implementation may be more efficient, as it removes one heat exchanging step. However, such an implementation also causes water from the cooling tower 118 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 126 is provided in the condenser water circuit to supply make-up water to the circuit. Make-up water may generally be needed because cooling tower 118 operates by evaporating large amounts of water from the circuit. The control valve 126 may be tied to a water level sensor in cooling tower 118, or to a basin shared by multiple cooling towers. When the water falls below a predetermined level, control valve 126 may be caused to open and supply additional makeup water to the circuit. A back-flow preventer (BFP) may also be provided in the make-up water line to prevent flow of water back from cooling tower 118 to a main water system, which may cause contamination of such a water system.

Optionally, a separate chiller circuit may be provided. Operation of system 100 may switch partially or entirely to this circuit during times of extreme atmospheric ambient (i.e., hot and humid) conditions or times of high heat load in the data center 101. Controlled mixing valves 134 are provided for electronically switching to the chiller circuit, or for blending cooling from the chiller circuit with cooling from the condenser circuit. Pump 128 may supply tower water to chiller 130, and pump 132 may supply chilled water, or cooling water 150, from chiller 130 to the remainder of system 100. Chiller 130 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 122, with common return water from a cooling coil to both structures. The chilled water may be supplied from chiller 130 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 100.

Pumps 120, 124, 128, 132, may be provided with variable speed drives. Such drives may be electronically controlled by a central control system to change the amount of water pumped by each pump in response to changing setpoints or changing conditions in the system 100. For example, pump 124 may be controlled to maintain a particular temperature in workspace 106, such as in response to signals from a thermostat or other sensor in workspace 106.

In operation, system 100 may respond to signals from various sensors placed in the system 100. The sensors may include, for example, thermostats, humidistats, flowmeters, and other similar sensors. In one implementation, one or more thermostats may be provided in warm air plenums 104a, 104b, and one or more thermostats may be placed in workspace 106. In addition, air pressure sensors may be located in workspace 106, and in warm air plenums 104a, 104b. The thermostats may be used to control the speed of associated pumps, so that if temperature begins to rise, the pumps turn faster to provide additional cooling waters. Thermostats may also be used to control the speed of various items such as air handling system 110 to maintain a set pressure differential between two spaces, such as attic 105 and workspace 106, and to thereby maintain a consistent airflow rate. Where mechanisms for increasing cooling, such as speeding the operation of pumps, are no longer capable of keeping up with increasing loads, a control system may activate chiller 130 and associated pumps 128, 132, and may modulate control valves 134 accordingly to provide additional cooling.

Various values for temperature of the fluids in system 100 may be used in the operation of system 100. In one exemplary implementation, the temperature setpoint in warm air plenums 104a, 104b may be selected to be at or near a maximum exit temperature for trays in racks 102a, 102b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 100.

Using these parameters and the parameters discussed above for entering and exiting air, relatively narrow approach temperatures may be achieved with the system 100. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

In certain implementations, the entering water temperature may be 64° F. (18° C.) and the exiting air temperature 77° F. (25° C.), as noted above, for an approach temperature of 12.6° F. (7° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

As illustrated, the system 100 also includes a control valve and a controller 145 operable to modulate the valve in response to or to maintain, for example, an approach temperature setpoint of the cooling coils 112a and 112b. For example, an airflow temperature sensor 155 may be positioned at a leaving face of one or both of the cooling coils 112a and 112b. The temperature sensor 155 may thus measure a leaving air temperature from the cooling coils 112a and/or 112b. A temperature sensor 160 may also be positioned in a fluid conduit that circulates the cooling water 150 to the cooling coils 112a and 112b (as well as fan coil 114).

Controller 145, as illustrated, may receive temperature information from one or both of the temperature sensors 155 and 160. In some implementations, the controller 145 may be a main controller (i.e., processor-based electronic device or other electronic controller) of the cooling system of the data center, which is communicably coupled to each control valve of the data center and/or individual controllers associated with the control valves. For example, the main controller may be a master controller communicably coupled to slave controllers at the respective control valves. In some implementations, the controller 145 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations. In some implementations, the controller 145 may be all or part of a distributed control system.

In operation, the controller 145 may receive temperature information (e.g., information about an outside airflow 107, a return airflow from the data center such as the heated air 117, the supply airflow 115, other airflows, and other cooling fluids), as well as information regarding an air quality of the outside environment, and control the operation of the air handling system 110. The air quality of the outside environment may be measured by an air quality sensor 121 positioned in the outside environment or in an outside airflow 107 circulated from the outside environment and through the illustrated fenestrations in the data center attic 105.

Figure 2A:
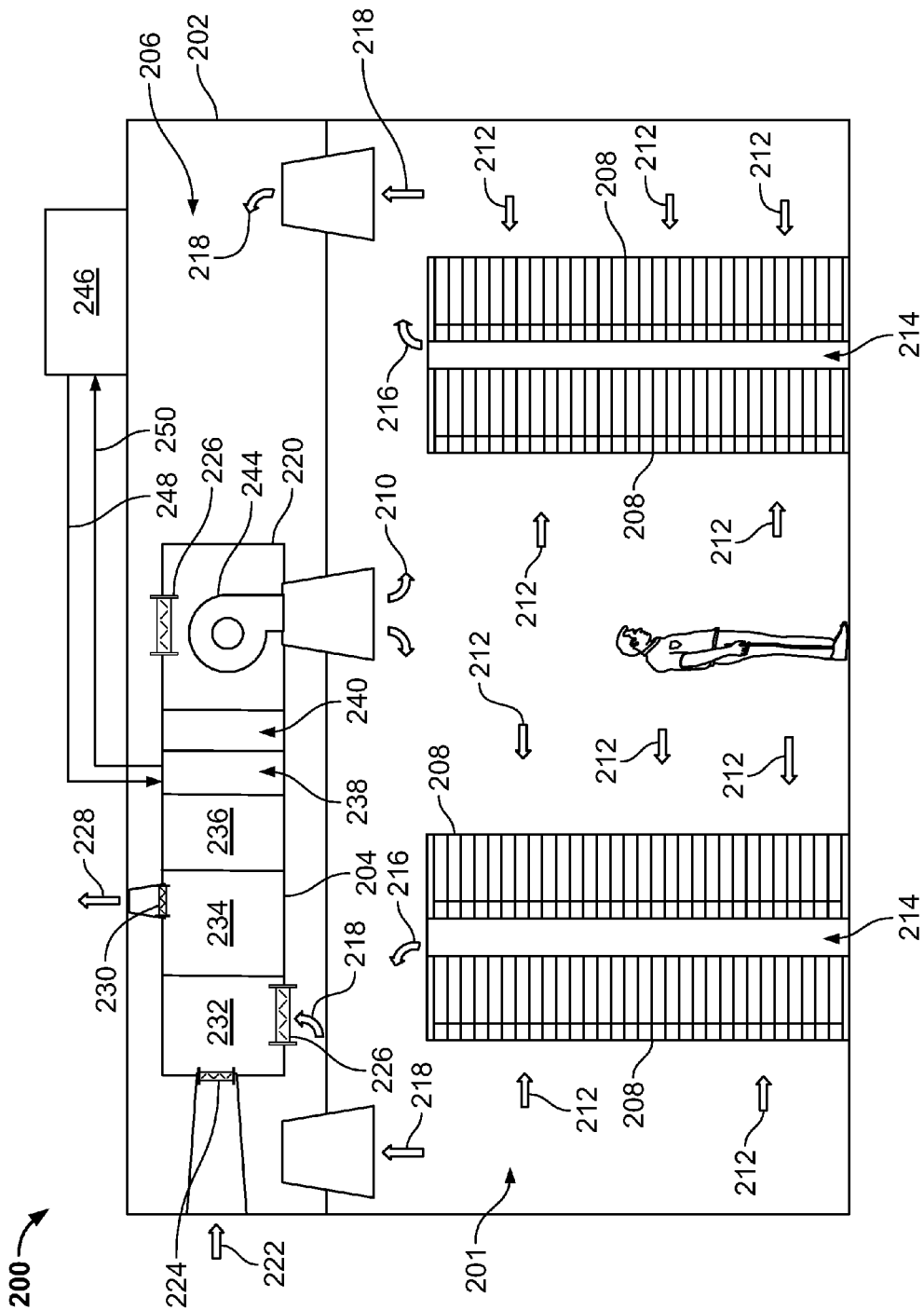
FIG. 2A-2B illustrate example implementations of systems for cooling a computer data center with an air handling system operable in multiple airflow modes.
Figure 2B:
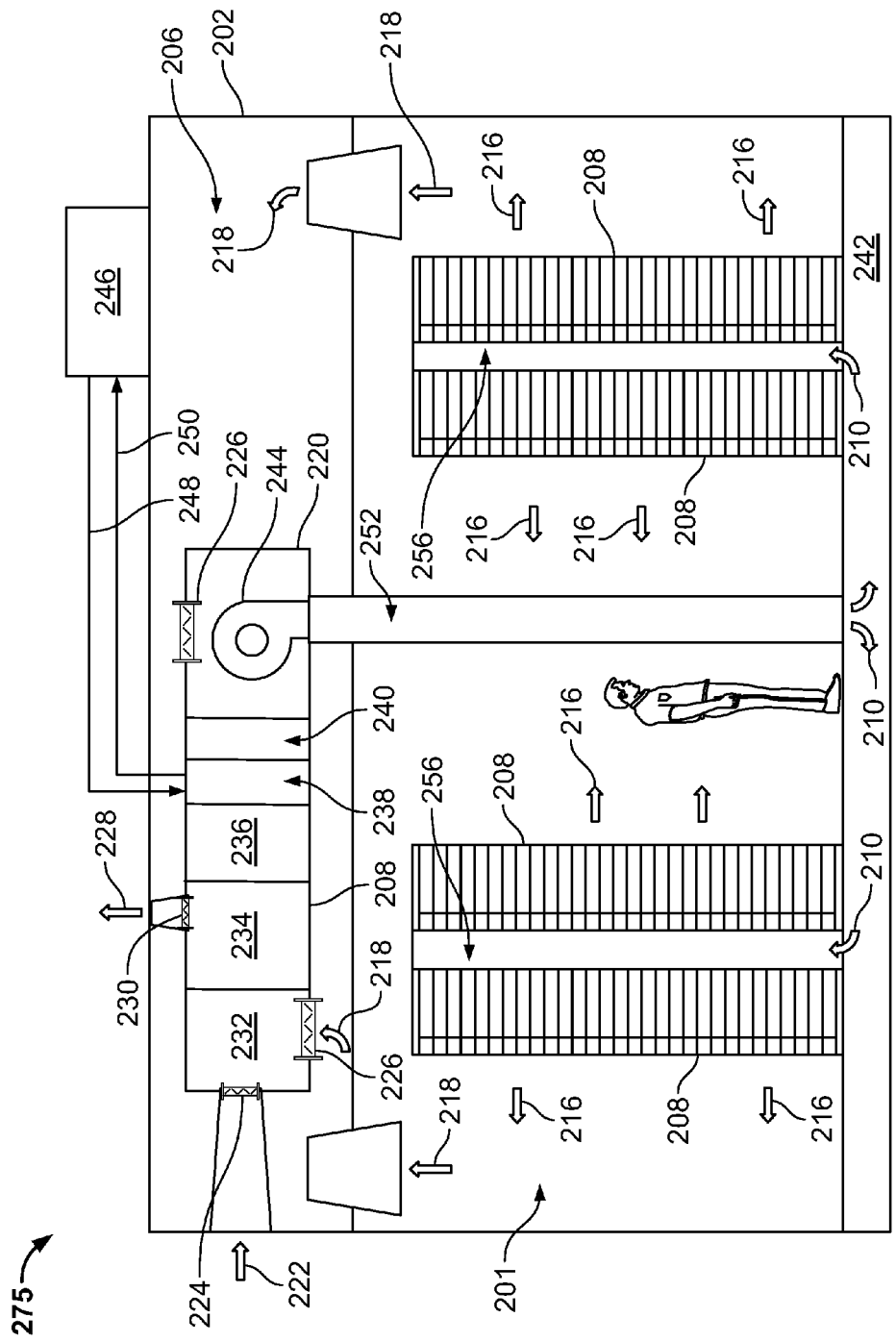

FIGS. 2A-2B illustrate example implementations of systems 200 and 275 for cooling a computer data center 202 with an air handling system 204 operable in multiple airflow modes. Turning specifically to FIG. 2A, system 200 includes data center 202, which includes a return plenum 206, and a human-occupiable workspace 201 housing one or more racks 208. Each rack 208 may support multiple trays of computing devices that generate heat during operation. Air handling system 204 may introduce supply air 210 into the workspace 201. The supply air 210 may mix with the ambient air of the workspace 201 to form workspace air 212 (e.g., a mixed airflow). The workspace air 212 may be drawn, for example by fans, into the racks 208 and across the supported computing devices into a warm air plenum 214 between adjacent racks. As described above, the fans can be programmed to maintain a particular, constant temperature rise across the trays of computing devices. The heated air 216 may be routed upward through the warm air plenum 214. As the heated air 216 exits the warm air plenum 214, at least a portion of it may disperse into the workspace 201 and mix with the supply air 210 to form the workspace air 212. However, a majority of the heated air 216 may be collected in the return plenum 206 by the air handling system 204 as return air 218.

In some implementations, the system 200 can be configured or tuned to maintain the workspace air 212 at appropriate temperature and humidity levels to accommodate occupants of the workspace 201. For example, the temperature and flow rate of the supply air 210 introduced into the workspace 201 can be regulated so as to maintain suitable conditions for occupants. Alternatively, the temperature and flow rate of the supply air 210 may be regulated to maintain a temperature of the heat-generating electronics supported in the racks 208 that is just below a maximum operational temperature of such electronics. Other process variables and parameters can also be controlled for this purpose (e.g., the temperature rise across the trays of computing devices).

As noted above, the air handling system 204 may be operable in multiple airflow modes. Accordingly, the air handling system 204 may include multiple cooling modules. For example, as shown, air handling system 204 may include an indirect economizer module 234 and a direct economizer module 236. The indirect economizer module 234 may be an indirect air-side economizer that uses "scavenger air" (e.g., outside air) to cool a flow of supply air. For example, the indirect economizer module 234 may evaporatively cool the scavenger air, and utilize the cooled scavenger air to remove heat from the supply air using a heat exchanger (e.g., an air-to-air heat exchanger). In this process, the scavenger air is maintained completely separate from the supply air, such that there is no mixing of the air flows. As a result, the supply air is cooled without increasing its moisture content or introducing unwanted contaminants that may be carried by the scavenger air. Heated scavenger air 228 may be expelled from the system through exhaust dampers 230.

The direct economizer module 236 may implement direct evaporative cooling on the supply air, using the latent heat of evaporation to lower the supply air temperature. For example, direct economizer module 236 may introduce the supply air to a source of liquid water (e.g., a wetted media or a fine spray). Heat from the supply air may be used to evaporate the liquid water into water vapor that is carried away by the supply air flow, increasing its moisture content and decreasing its dry bulb temperature.

An air supply module 232 upstream of the indirect and direct economizer modules may selectively draw in outside air 222 though outside air dampers 224 and/or return air 218 from the return plenum 206 through return air dampers 226 to create the flow of supply air. For example, the supply module 232 may be operable to draw in only outside air 222, only return air 219, or a mixture of both. Air drawn in by the air supply module 232 may be provided to the indirect economizer module 234 and the direct economizer module 236 for cooling. Supply air, in some instances cooled by the economizer module(s), can be passed through a cooling coil 238 for optional supplemental cooling.

As shown, supply cooling fluid 248 may be provided to the cooling coil 238 by a cooling unit 246 (e.g., a direct expansion (DX) condensing unit or a cooling plant). Once the cooling fluid 248 has passed through the cooling coil 238, it may be circulated back to the cooling unit 246 as return cooling fluid 250, forming a closed-loop system. The air handling system 204 may also include a filter 240 for removing unwanted particulates from the cooled supply air (for example, when outside air 222 is drawn in by the air supply module 232). A supply fan 244 may be used to circulate the cooled supply air 210 into the workspace 201. When the supply air temperature is lower than a desired setpoint, warm return air 218 can be mixed in with the supply air 210 through return air dampers 226.

Turning now to FIG. 2B, the system 275 may include a supply air plenum 252 for accepting supply air 210 that has been cooled and conditioned by the air handling system 204. More specifically, the supply fan 244 may circulate the supply air 210 downward through the supply air plenum 252 which opens into am underfloor plenum 242. The supply air 210 may be circulated, from the underfloor plenum 242, into cool air plenums 256 between adjacent racks 208 and across the trays of computing devices. The heated air 216 may be expelled into the workspace 201 to provide the ambient workspace air. In some implementations, the system 200 can be configured or tuned to maintain the heated air 216 at appropriate temperature and humidity levels to accommodate occupants of the workspace 201, or, alternatively, to maintain the heat-generating electronics in the racks 208 at or below a maximum operational temperature. The heated air 216 may be collected in the return plenum 206 by the air handling system 204 as return air 218.

Figure 3:
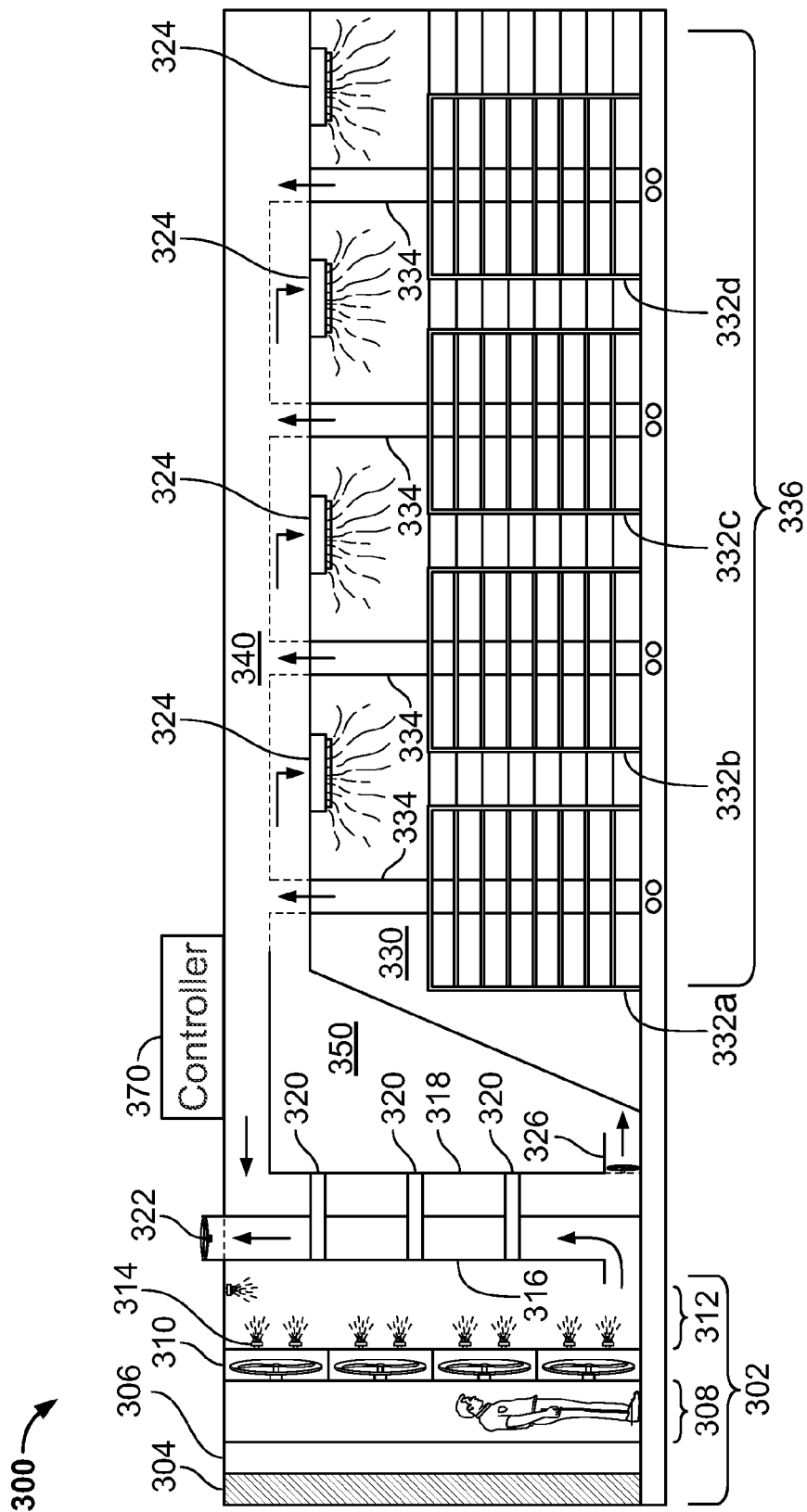
FIG. 3 is a side view of an example data center that implements air-to-air heat exchangers and evaporative cooling.

FIG. 3 is a side view of an example data center 300 that implements air-to-air heat exchangers and evaporative cooling. Generally speaking, the data center 300 is configured in a manner similar to the data center 100 of FIGS. 1A-1D, except that that the racks of computers are not substantially exposed to the evaporatively cooled outside air. Instead, the evaporatively cooled outside air is used to cool the warm indoor air through heat exchangers. In some implementations, keeping the outside and indoor air substantially separated may be desirable when, for example, the outdoor air is generally dirty at the data center's location (e.g., a dusty desert location, a smoggy urban location, a pollen-rich rural area).

The data center includes an evaporative cooling system 302 controlled by a controller 370. In some implementations, the evaporative cooling system 302 may be the evaporative cooling system 112. In some implementations, the controller 370 may be a computer configured to receiving readings from various sensors placed about the data center 300 (e.g., thermostats, humidistats, flow sensors, pressure transducers) and respond to the sensed values by altering the operation of the evaporative cooling system 302 (e.g., changing atomizer flow rates, louver positions, fan speeds). In some implementations, the controller 370 may be substantially similar in function to the controller 170 of FIG. 1.

A set of louvers 304 are selectively opened to permit outside air to flow through the louvers 304 and a filter 306 into an entry zone 308. A collection of fans 310 draw the air from the entry zone 308 to an evaporation zone 312. Within the evaporation zone 312, a collection of atomizers 314 controllably sprays atomized water into the drawn air. As the atomized water evaporates, heat energy is drawn out of, and thereby cools, the air within the evaporation zone 312. The cooled outside air is passed through an outside air plenum 316 that substantially intersects with one or more heat exchangers 320, and is finally exhausted back to the outside by an exhaust fan 322.

A workspace 330 is defined around a number of parallel rows of computers mounted in vertical racks, such as racks 332a, 332b, 332c, 332d included in a rack zone 336. Air may circulate from the workspace 330 across the trays and into hot exhaust spaces behind the trays (not shown). As the air flows across the trays, the air absorbs heat that is generated by the computers thereby cooling the trays and heating the air. The heated air may be routed upward into a hot air plenum 340, by chimney plenums 334, or into a raised floor or basement, or other appropriate space, and may be gathered there by air handling units that include, for example, one or more fans appropriately sized for the task.

A circulation fan 326 draws the heated air through the hot air plenum to an indoor air plenum 318 that substantially intersects with the heat exchangers 320. As the heated indoor air passes though the heat exchangers 320, heat energy from the heated air is transferred to the cooled outdoor air. In other words, the cool outdoor air is heated by cooling the hot indoor air without substantial mixing of the indoor and outdoor air.

The cooled indoor air is then drawn through the fan 326 into a cool air plenum 350. The cool air plenum 350 routes the cooled indoor air to one or more diffusers, e.g., diffusers 324 such that the cooled indoor air is distributed into the rack zone 336 and throughout the work space 330.

In some implementations, the heat exchangers 320 can be air-to-air heat exchangers. In a particular example, the air-to-air heat exchangers are heat wheel heat exchangers. In the example shown, there are three heat exchangers 320 arranged in series. In other implementations, more or less heat exchangers can be used and they can be positioned in series or in other configurations relative to each other.

Figure 4B:
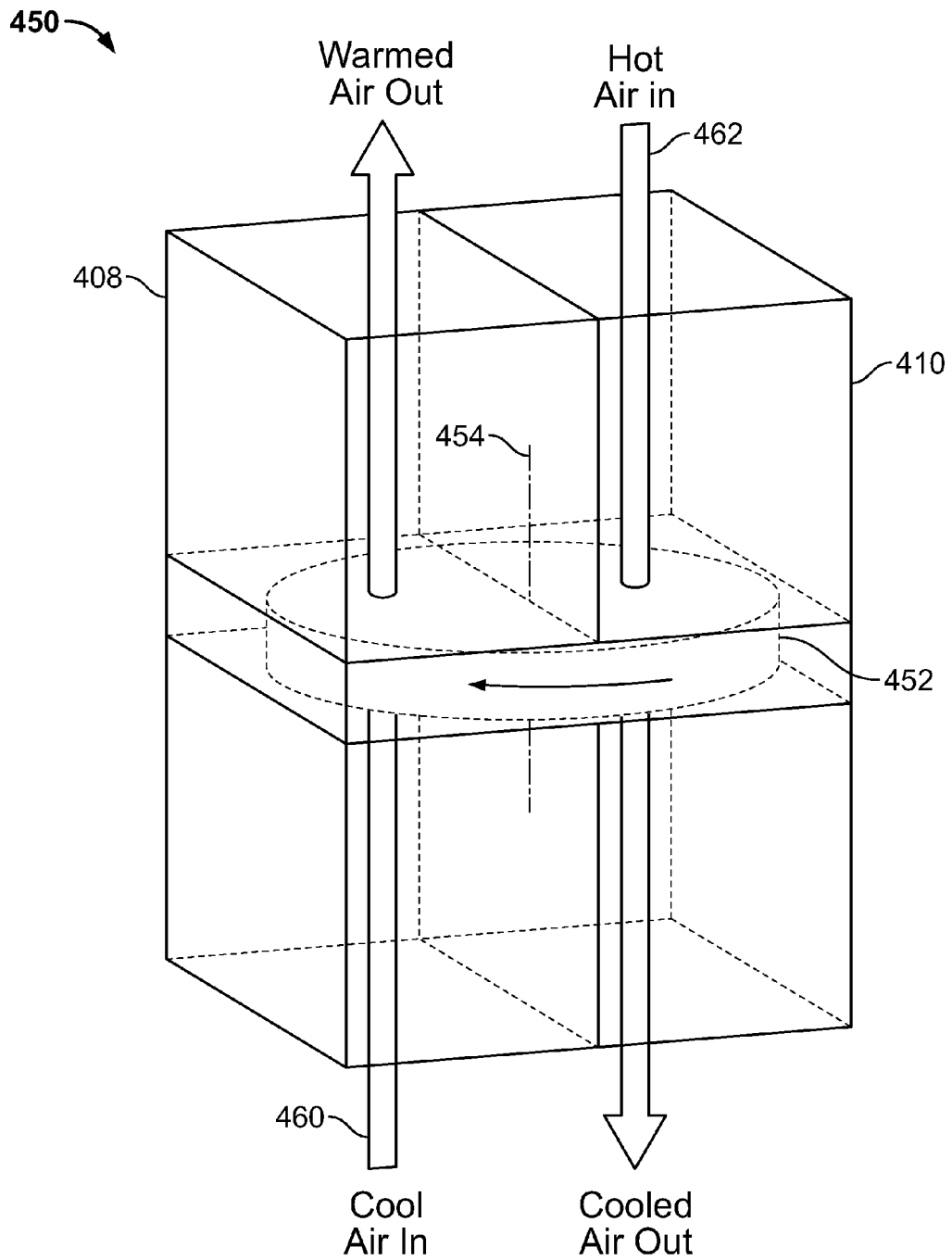

FIGS. 4A and 4B provide a close-up view of an example evaporative cooling system 400 that can be the evaporative cooling system 302 of FIG. 3. In this example, the heat exchangers 320 are air-to-air heat wheel exchangers 450. It should be understood however, that other forms of heat exchangers can be used. The evaporative cooling system 400 includes a number of fans 402 and a collection of atomizers 404. Outside air is drawn through the fans 402 into an evaporation zone 406. Within the evaporation zone 406, a controlled atomized mist of water provided by the atomizers 404 is evaporated. As the water evaporates, the outside air is cooled. Example processes for controlling the evaporative cooling of air using heat exchangers is discussed in the descriptions of FIGS. 7A-7F, 8, and 9.

The cooled outside air flows into an outside air plenum 408 that substantially intersects with the heat exchangers 450. The heat exchangers 450 also substantially intersect an indoor air plenum 410. The indoor air plenum 410 carries hot air from the data center and through the heat exchangers 450. The heat exchangers 450 transfer heat energy from the hot indoor air to the cooled outside air, thereby cooling the indoor air and heating the outside air. In some implementations, since the outside air may be substantially isolated from a work space (e.g., the work space 330 of FIG. 3), this form of cooling may be referred to as "indirect" cooling.

The heated outside air is exhausted to the outdoors by a vent 412 that, in some implementations, may include a vent fan 414. The cooled indoor air is drawn out to the data center by a fan 416. In some implementations, the flow of air to the data center may be measured by a flow meter. In some implementations, the cooled air may be cooled further by evaporatively cooling the air with a controllable water mist provided by a collection of atomizers 418 within a misting evaporation zone 420.

In the example of the evaporative cooling system 400, the heat exchangers 450 implement a technology referred to as "heat wheels". Generally speaking, a heat wheel is a rotary heat exchanger that operates on the air-to-air principle of heat transfer. It can provide a way of recovering air conditioning energy in hot, humid climates. Heat wheels can improve air-side economization (e.g., free cooling, the use of outside air to cool servers in the data center). Rather than introducing exterior air directly into the data center, the heat wheel briefly mixes the outside air and exhaust air to create an "air-to-air" heat exchanger. Some examples of heat wheels that may be used in various implementations of the evaporative cooling system 400 are the "TC" and "TF" series "Thermowheel" heat wheel products available from Thermotech Enterprises, Inc. of Tampa, Fl.

Referring now to FIG. 4B, one of the heat exchangers 450 is shown in additional detail. A heat wheel 452 rotates about an axis 454. Cool (and in some situations, dry) outside air 460 enters one side of the rotating heat wheel 452 and passes through a heat transfer media (not shown), chilling the heat wheel 452. In some implementations, the heat transfer media may be coated with a desiccant, and the cool exhaust air 460 may flow over the heat transfer media, thereby drying the desiccant. This cool and/or dry part of the heat wheel 452 then rotates into a supply of indoor air 462 where it absorbs heat, and in some implementations humidity, from the hot indoor air 462. In some implementations, the heat wheel 452 may cool the indoor air 462 without allowing the indoor air 462 and the outside air 460 to substantially mix.

In some implementations, the heat wheel 452 may include a heat transfer media, e.g., made out of corrugated aluminum foil with a high surface area per volume and laminar flow. In some implementations, dry particles (e.g., up to 900 microns) may pass freely through the media. In some implementations, the heat transfer media may be supplied with a "Balanced Sieve" (e.g., 3 Å or 4 Å molecular sieve) hygroscopic solid desiccant coating for selective adsorption of water vapor and substantially equal sensible and latent heat transfer. In some implementations, the edges of the heat transfer media may include an anti-corrosion epoxy coating.

Figure 5A:
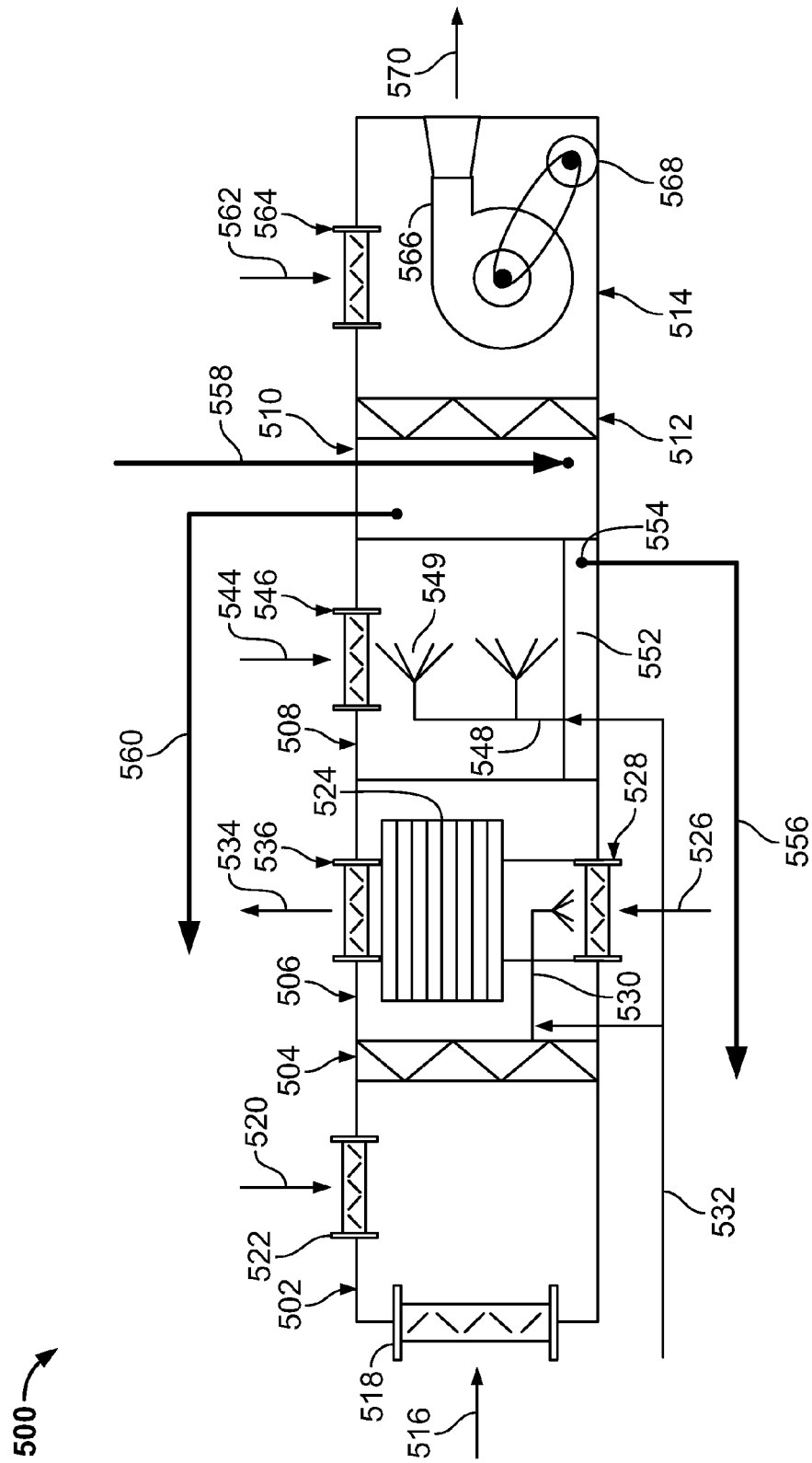
FIG. 5A illustrates an example implementation of an air handling system operable in multiple airflow modes.

FIG. 5A illustrates an example implementation of an air handling system 500 operable in multiple airflow modes. The air handling system 500 will be described in the context of a multistage, indirect-direct evaporative cooling process, however, other operational modes can also be implemented (e.g., a single stage evaporative cooling process, as described in detail below). As shown, the illustrated air handling system 500 includes an air supply module 502 configured to selectively draw in outside air 516 through outside air dampers 518 and/or return air 520 through return air dampers 522. For example, the outside air dampers 518 and the return air dampers 522 can be selectively controlled (e.g., opened, closed, modulated) to draw in a desired content of air (e.g., only outside air, only return air, or a mixture of both outside air and return air). The air mixture drawn in by the supply air module 502 forms a flow of supply air that may be conditioned for use in cooling a data center as supply air 570.

The supply air may be passed through a filter 504 (e.g., to remove debris, particle and gaseous contaminants, odors, and other particles) and into an indirect economizer module 506. The indirect economizer module 506 may also receive a supply of scavenger air 526 through scavenger air dampers 528. The scavenger air may, for example, be unfiltered outside air, or air from any other appropriate source. The scavenger air 526 may be passed through a fine mist (e.g., a micro-fine mist) of appropriate misting fluid (e.g., liquid water or another suitable coolant) provided by mister 530 to implement direct evaporative cooling of the scavenger air 526. In some implementations, wetted media is used to implement the evaporative cooling of the scavenger air 526. Once cooled, the scavenger air 526 may be passed through the cold side of an air-to-air heat exchanger 524. The filtered supply air may be passed through the hot side of the heat exchanger 524, such that heat from the supply air is rejected to the cooled scavenger air 526 without direct contact or mixing of the air flows. As a result, the supply air can be cooled without increasing its moisture content or being contaminated by unwanted particulates or gases that may be present in the scavenger air 526. Upon exiting the heat exchanger 524, a scavenger air exhaust 534 may be expelled from the indirect economizer module 506 through scavenger air dampers 536. In some implementations, for example, when scavenger air 526 is at or below a predetermined temperature (e.g., dry bulb and/or wet bulb), mister 530 may be shut off so that no or very little liquid is introduced into the scavenger air 526.

Supply air exiting the indirect economizer module 506 is circulated to the direct economizer module 508. The direct economizer module 508 may include a mister 548 configured to provide a mist of fluid 549. The flow of supply air may be passed through the misting fluid 549 to implement direct evaporative cooling. As noted above, in some examples, wetted media can be used to implement direct evaporative cooling. Any excess misting fluid 549 (e.g., misting fluid that is not evaporated in cooling the supply air) may be collected in a sump 552 and removed from the direct economizer module 508 through a drain 554 as waste fluid 556. The direct economizer module 508 may also include outside air dampers 546 for drawing in an outside airflow 544. In some implementations, the outside air 544 can be provided as a supply air flow which can be conditioned through direct evaporative cooling, while bypassing the indirect economizer module 506.

Supply air cooled by the economizer module(s) may be passed through a cooling coil 510 for additional cooling. The cooling coil 510 may receive a flow of chilled supply fluid 558, for example from an appropriate cooling unit such as a condensing unit, chiller, cooling tower, or other cooling unit (not shown). The chilled supply fluid 558 may circulate through the cooling coil 510 and discharge, as return fluid 560, back to the cooling unit, forming a closed loop system. Supply air exiting the cooling coil 510 may flow through a filter 512 (e.g., to clean or further clean the supply air) and into a fan module 514. As shown, the fan module 514 may include a motorized fan 566 (fan motor indicated by reference number 568) that circulates cooled supply air 570 from the air handling system 500. The fan module may also include return air dampers 564 for optionally mixing return air 562 with the cooled supply air. As illustrated, the fan 566 is a double-width, double inlet (DWDI) centrifugal fan. However, in alternative implementations, the fan 566 may be a single-width, single-inlet (SWSI) or "plug" fan, or another type of air moving device.

Figure 5B:
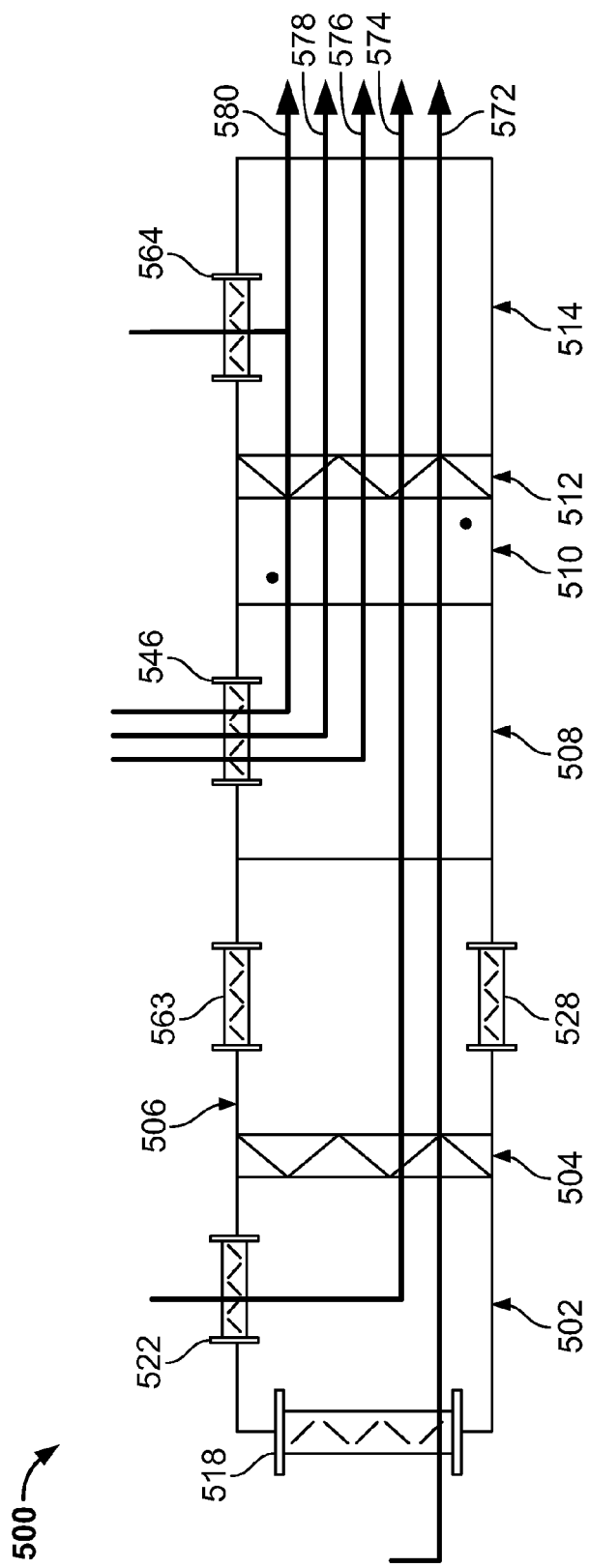
FIG. 5B illustrates airflow paths through an example implementation of an air handling system operable in multiple airflow modes.

FIG. 5B illustrates airflow paths 572, 574, 576, 578, and 580 through an example implementation of the air handling system 500 operable in multiple airflow modes. The first operation mode airflow path 572 provides a multi-stage, indirect-direct evaporative cooling process. In this mode, the supply air module 502 circulates in outside air through the outside air dampers 518. The outside air forms a supply airflow, which is passed through and cooled by the indirect economizer module 506 and the direct economizer module 508, as described above. The outside air dampers 546 and the return air dampers 522 and 564 may remain closed during this operation. The first operation mode airflow path 572 may be utilized when it is determined (e.g., by a controller communicably coupled to the air handling system 500) that the outside air is exceptionally warm and dry. For example, suitable conditions for implementing the first operation airflow path may include: 85° F. (44% RH), 90° F. (34% RH), 95° F. (25% RH), 100° F. (18% RH), 100° F. (31% RH), 100° F. (25% RH), 100° F. (14% RH), 105° F. (14% RH), 110° F. (10% RH), 110° F. (19% RH), 110° F. (15% RH), 110° F. (6% RH), 115° F. (7% RH), 120° F. (4.5% RH), 120° F. (12% RH), 120° F. (8% RH), and 120° F. (1.8% RH), to name a few examples.

The second operational mode airflow path 574 provides a substantially complete recirculation conditioning process. In this mode 574, the supply air module 502 circulates in return air through the return air dampers 522. The outside air dampers 518 and 546, as well as the return air dampers 564, may remain closed during this operation. The return air forms the supply airflow, which may be cooled by the indirect economizer module 506 and optionally the cooling coil 510, but not the direct economizer module 508. In this mode, direct evaporative cooling of the supply air may not be feasible without substantial dehumidification, due to the complete recirculation of the airflow. Accordingly, the direct economizer module 508 may be maintained in an inoperable state during this operation, such that no direct evaporative cooling is implemented on the supply air when it passes through the module 508. The second airflow path 574 may be utilized when it is determined (e.g., by a controller) that the outside air is unsuitable for data center cooling. For example, it may be determined that the outside air includes relatively high levels of certain unwanted contaminants (e.g., volcanic ash or harmful gasses from fire smoke).

The third operational mode airflow path 576 may provide a single stage direct evaporative cooling process. In this mode, outside air is circulated into the direct economizer module 508 through the outside air dampers 546. This outside air forms the supply airflow, which is cooled by the direct economizer module 508 and optionally the cooling coil 510, but not the indirect economizer module 506. As shown, the supply air bypasses the indirect economizer 506 in this mode. The outside air dampers 518 as well as the return air dampers 522 and 564, may remain closed during this operation. The third airflow path 576 may be utilized when it is determined that the outside air is relatively dry and warm. For example, suitable conditions for implementing the third operation airflow path 576 may include: 75° F. (60% RH), 80° F. (48% RH), 85° F. (18% RH), 85° F. (27% RH), 85° F. (35% RH), 85° F. (45% RH), 85° F. (56% RH), 90° F. (26% RH), 95° F. (7% RH), 95° F. (14% RH), 95° F. (20% RH), 95° F. (26% RH), 95° F. (35% RH), 100° F. (15% RH), 105° F. (1% RH), 105° F. (6% RH), 105° F. (10% RH), 105° F. (15% RH), 105° F. (20% RH), 110° F. (6.2% RH), and 115° F. (4% RH), to name a few examples.

The fourth operational mode airflow path 578 may not provide any cooling of the supply air within the air handling system 500. In this mode 578, outside air is circulated in through the outside air dampers 546 of the direct economizer module 508. The outside air forms the supply airflow. The outside air dampers 518 as well as the return air dampers 522 and 564, may remain closed during this operation. In this mode, all of the modular cooling systems (e.g., the indirect economizer module 506, the direct economizer module 508, and the cooling coil 510) may be maintained in an inoperative state, such that no cooling is implemented on the supply air in the air handling system 500. The fourth airflow path 578 may be utilized when it is determined that the outside air is suitable for data center cooling. For example, suitable conditions for implementing the fourth operation airflow path 578 may include: 60° F. (98% RH), 65° F. (58% RH), 65° F. (60% RH), 65° F. (74% RH), 65° F. (88% RH), 70° F. (55% RH), 75° F. (21% RH), 75° F. (30% RH), 75° F. (40% RH), 75° F. (50% RH), 75° F. (61% RH), 80° F. (28% RH), 85° F. (6% RH), 85° F. (13.5% RH), 85° F. (20% RH), 85° F. (27% RH), 85° F. (35% RH), 14° F. (10% RH), and 95° F. (8% RH), to name a few examples.

The fifth operational mode airflow path 580 provides a mixed supply airflow. In this mode 580, outside air is drawn in through the outside air dampers 546 of the direct economizer module 508. The outside air dampers 518 and the return air dampers 522 may remain closed during this operation. Similar to the fourth operational mode 578, all of the modular cooling systems may be maintained in an inoperative state, such that no cooling is implemented on the outside air within the air handling system 500. In some implementations, however, the outside air may be cooled by the direct economizer module 508. In this mode, if it is determined that the outside air temperature is below a predetermined setpoint, warm return air can be drawn into the fan module 514 through return air dampers 564 to mix with the cool outside air.

One or more controllers (not shown) may be used to operate the air handling system according to multiple airflow modes. For example, the controllers may be operatively connected to (e.g., physical or communicably coupled with) one or more components of the air handling system. Such components may include, but are not limited to, various sensors (e.g., temperature, humidity, contamination, and pressure sensors), valves (e.g., cooling fluid supply valves), dampers (e.g., return air and outside air dampers), and fans (e.g., a supply air fan). The controllers may be provided in the form of suitable computer hardware and/or software.

In some implementations, the controllers may operate independently of one another. In this manner, the different modes of operation may be effected by propagation through the various controllers. For example, a first controller may react to a change in a local parameter value, which in turn causes a second controller to react to the change, and so on. In some implementations, the individual controllers may be selectively operated by a master controller. For example, the master controller may issue global commands to the various controllers in order to switch between modes of operation.

Figure 6B:
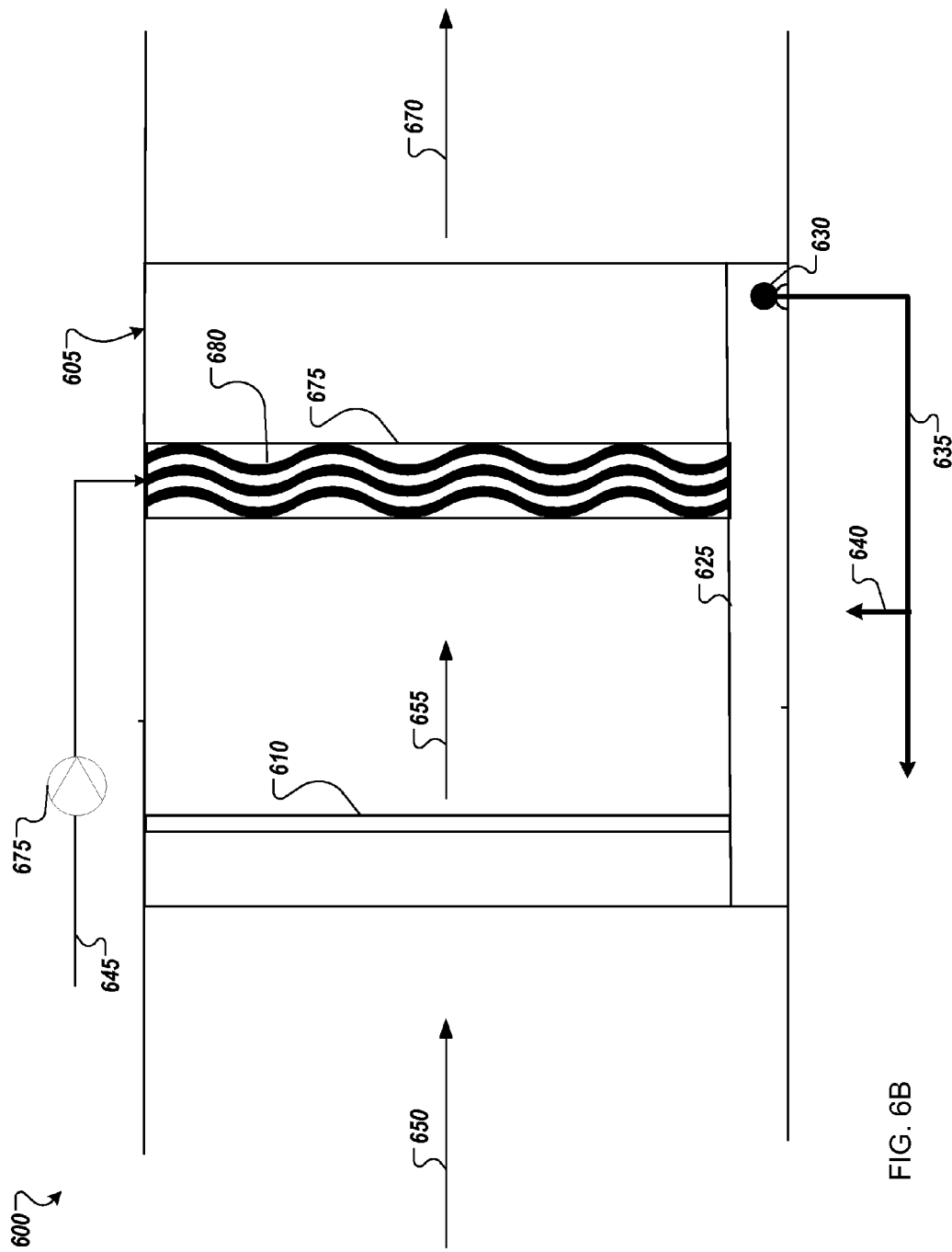
Figure 6C:
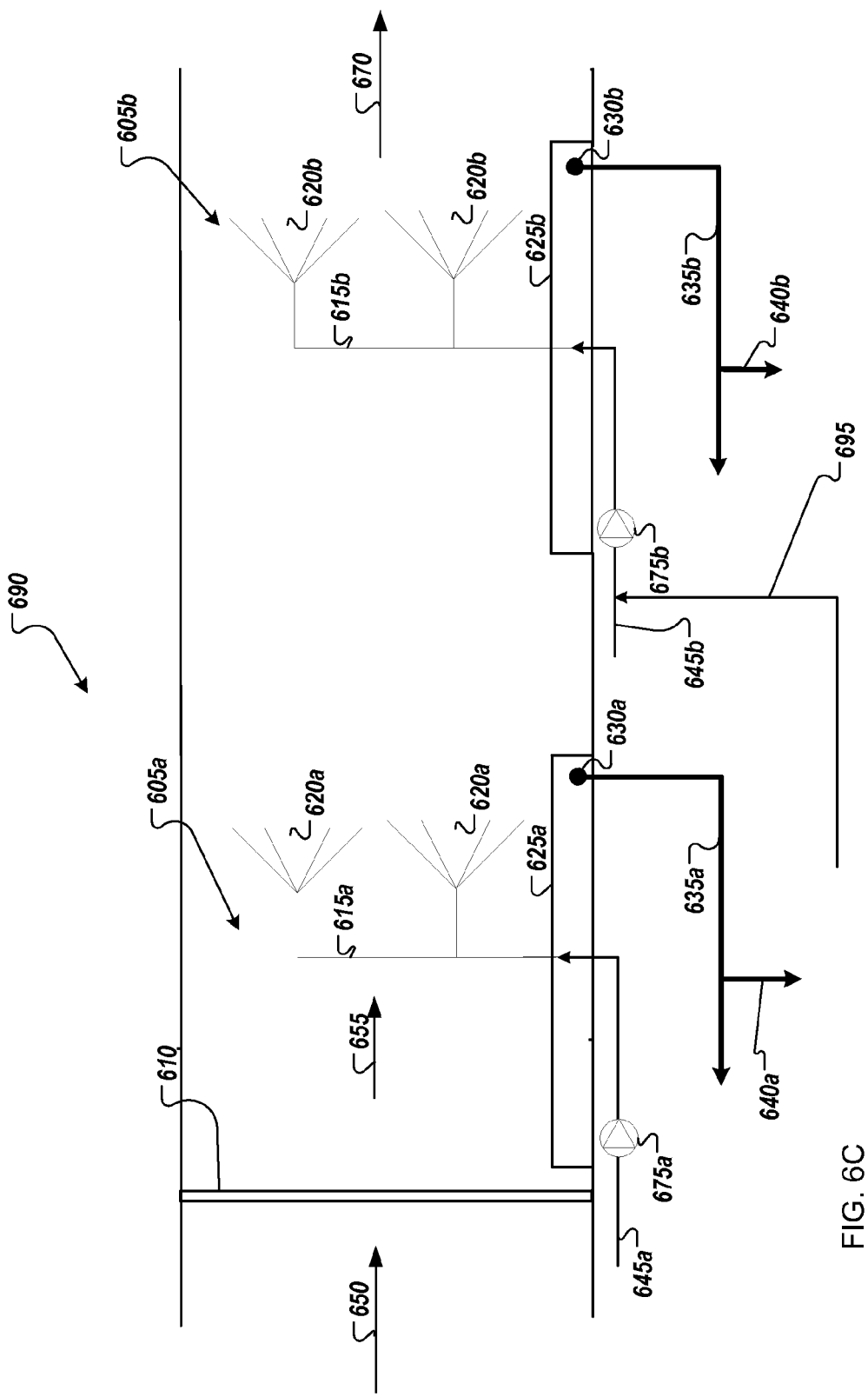

FIGS. 6A-6C illustrates example implementations of a direct economizer module for cooling a computer data center with an air handling system. Turning first to FIG. 6A, a direct economizer module 605 for cooling a computer data center with an air handling system 600 is illustrated. The direct economizer module 605 may include a mister 615 (e.g., an atomizer or humidifier type nozzle) coupled to a pump 675 providing a flow of cooling fluid 645. The mister 615 may be configured to spray the pressurized cooling fluid 645 as a mist 620 (e.g., a micro, or sub-micro, fine mist of liquid). The misting fluid 620 may be directed in the path of a supply airflow to implement evaporative cooling. For example, as shown, an outside airflow 650 is circulated through the direct economizer module 605, passing first through a filter 610 and subsequently through the spray of misting fluid 620. At least some of the misting fluid 620 may be evaporated by heat from the passing airflow 655. Evaporation of the misting fluid may adiabatically humidify the airflow, raising its moisture content while reducing its dry bulb temperature. The wet bulb temperature of the airflow may remain substantially constant. As shown, the cool, humidified air exits the direct economizer module as a flow of supply air 670, which may be circulated to a data center.

In some implementations, the pump 675 (or a valve between the pump 675 and mister 615) can be controlled such that the spray of misting fluid 620 is provided at a selected flow rate. For example, the flow rate can be selected such that nearly all of the misting fluid 620 is continuously evaporated by the filtered airflow 655, as the airflow circulates through the direct economizer module 605. In some implementations, the flow rate can be selected such that excess misting fluid (i.e., mixing fluid that is not evaporated by the airflow 655) is provided in the airflow path. The excess misting fluid may be collected in a sump 625 and removed from the direct economizer module 605 through drain 630. Fluid drained from the sump 625 can be optionally disposed as wastewater 635 or recirculated as supply fluid 640.

In some implementations, the excess misting fluid can be used to provide filtration or "scrubbing" of the airflow 655. For example, contaminants in the airflow may be removed by dissolving the contaminant particles in the excess misting fluid and/or precipitating insoluble contaminant particles. Contaminants removed by the excess misting fluid may be drained from the sump 625 as wastewater 635. In some examples, chemical additives can be mixed into the misting fluid 620 to accentuate the airflow scrubbing. For example, when liquid water is used as the misting fluid, oxidants can be added to oxidize contaminant gases, making them more soluble in water.

The direct economizer module 605 has been shown and described as including a mister for humidification and optional scrubbing of the passing outside airflow. However, in some implementations, appropriate media (e.g., pads of woven fibers, corrugated paper, or corrugated plastic, to name a few materials) saturated with cooling fluid may be used for this purpose, as shown in FIG. 6B. As illustrated in FIG. 6B, the direct economizer module 605 includes a media 756 positioned in the airflow stream and includes, for example, corrugated plastic 680. In this implementation, airflow 655 passes through the media 675 while the cooling fluid 645 is sprayed, dripped, or otherwise introduced over the corrugated plastic 680 (or other suitable media material). As with the implementation in FIG. 6A, the flow rate can be selected such that nearly all of the cooling fluid 645 is continuously evaporated by the airflow 655, as the airflow circulates through the media 675. In some implementations, the flow rate can be selected such that excess misting fluid (i.e., mixing fluid that is not evaporated by the airflow 655) is provided in the airflow path. The excess misting fluid may be collected in the sump 625 and removed from the direct economizer module 605 through drain 630. Fluid drained from the sump 625 can be optionally disposed as wastewater 635 or recirculated as supply fluid 640.

Turning to FIG. 6C, another example implementation is illustrated having a multi-stage direct economizer cooling module 690. As illustrated, the multi-stage module 690 includes two direct economizer modules 605a and 605b, each with a respective mister 615a or 615b (e.g., an atomizer or humidifier type nozzle) coupled to a respective pump 675a or 675b providing a flow of cooling fluid 645a or 645b. In alternative implementations of the multi-stage module 690, more modules 605 may be utilized. In addition, one or more of the modules 605a and 605b may alternatively utilize a media-based direct evaporative cooling module as shown in FIG. 6B. Further, in some implementations, the multi-stage module 690 may be part of a packaged air handling unit; alternatively, the multi-stage module 690 may be arranged in a distributed air handling system. For example, one or more cooling stages of the multi-stage module 690 may be located in different locations of the distributed air handling system and in fluid communication through, for example, a ductwork system.

An outside airflow 650 is circulated through a filter 610 and then through the upstream direct economizer module 605a, and subsequently through the spray of misting fluid 620a. At least some of the misting fluid 620a may be evaporated by heat from the passing airflow 655. Evaporation of the misting fluid may adiabatically humidify the airflow, raising its moisture content while reducing its dry bulb temperature. The wet bulb temperature of the airflow may remain substantially constant. The cooled airflow is then circulated through the downstream direct economizer module 605b, and subsequently through another spray of misting fluid 620b. At least some of the second stage misting fluid 620b may be evaporated by heat from the passing airflow. As shown, the cool, humidified air exits the multi-stage module 690 as a flow of supply air 670, which may be circulated to a data center.

In some implementations, the pumps 675a and 675b (or a valve between the respective pumps 675a and 675b and misters 615a and 615b) can be controlled such that the spray of misting fluids 620a and 620b are each provided at a selected flow rate. The selected flow rates of the respective fluid 620a and 620b may be substantially identical or different. For example, the flow rate(s) can be selected such that nearly all of the misting fluids 620a and/or 620b are continuously evaporated by the filtered airflow 655, as the airflow circulates through the multi-stage module 690. Excess misting fluid may be collected in sumps 625a and/or 625b and removed from the multi-stage module 690 through drains 630a and/or 630b. Fluid drained from the sumps 625a and/or 625b can be optionally disposed as wastewater flows 635a and/or 635b or recirculated as supply fluids 640a and/or 640b.

In some implementations, the excess misting fluid can be used to provide filtration or "scrubbing" of the airflow 655. For example, contaminants in the airflow may be removed by dissolving the contaminant particles in the excess misting fluid and/or precipitating insoluble contaminant particles. Contaminants removed by the excess misting fluid may be drained from the sumps 625a and/or 625b as wastewater flows 635a and/or 635b. In some examples, chemical additives can be mixed into one or both of the misting fluids 620a and 620b to accentuate the airflow scrubbing. For example, when liquid water is used as the misting fluid, oxidants can be added to oxidize contaminant gases, making them more soluble in water.

In some implementations of the implementation shown in FIG. 6C for example, the selected flow rate and composition of the cooling fluid 645a may be sufficient to cool the airflow 655 to a particular setpoint condition (e.g., dry bulb temperature, wet bulb temperature, and/or relative humidity). The flow rate and composition of the cooling fluid 645b may be selected to provide a sufficient amount of chemicals 695 that are added to the cooling fluid 645b to precipitate and/or dissolve contaminants from the cooled airflow 655. Thus, in some implementations, the upstream direct evaporative cooling module 605a may be primarily used for conditioning of the airstream 655, while the downstream direct evaporative cooling module 605b may be primarily used for treatment of the airstream 655. In alternative implementations, the upstream direct evaporative cooling module 605a may be primarily used for treatment of the airstream 655, while the downstream direct evaporative cooling module 605b may be primarily used for conditioning of the airstream 655. In even further alternative implementations, both modules 605a and 605b may condition and treat the airstream 655.

Figure 7A:
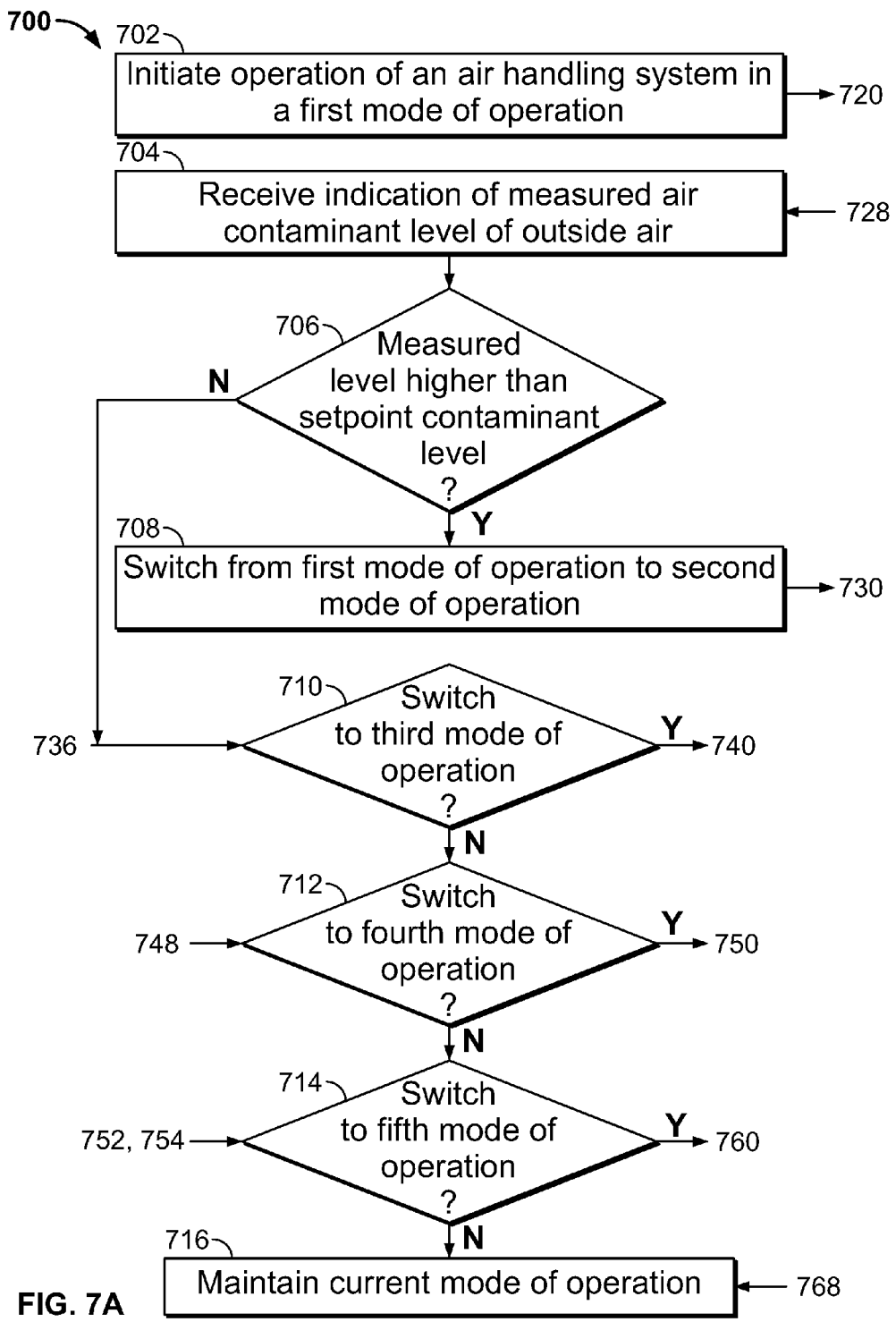
FIGS. 7A-7F illustrate an example method for cooling a computer data center with an air handling system, operable in two or more modes of operation.
Figure 7B:
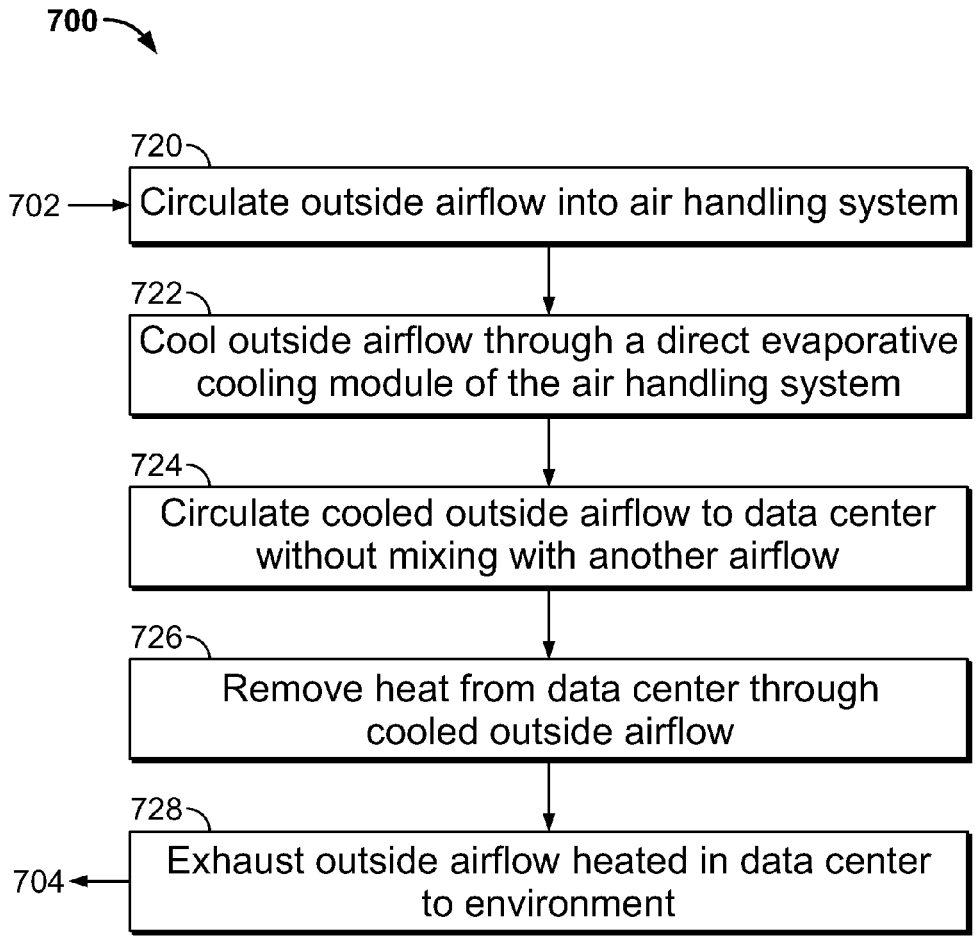

FIGS. 7A-7F illustrate an example method 700 for cooling a computer data center with an air handling system operable in two or more modes of operation. Referring FIG. 7A, operation of an air handling system in a first mode of operation is initiated (702). Turning now to FIG. 7B, in the first mode of operation, an outside airflow is circulated into the air handling system (720). The outside airflow is cooled through a direct evaporative cooling module of the air handling system (722). The cooled outside airflow is circulated to a data center without mixing with other airflows (724). Heat is removed from the data center through the cooled outside airflow (726). For example, the cooled outside airflow can be routed pulled through racks supporting trays of computing devices generating heat. The outside airflow heated in the data center is exhausted to the outside environment surrounding the data center (718).

Figure 7C:
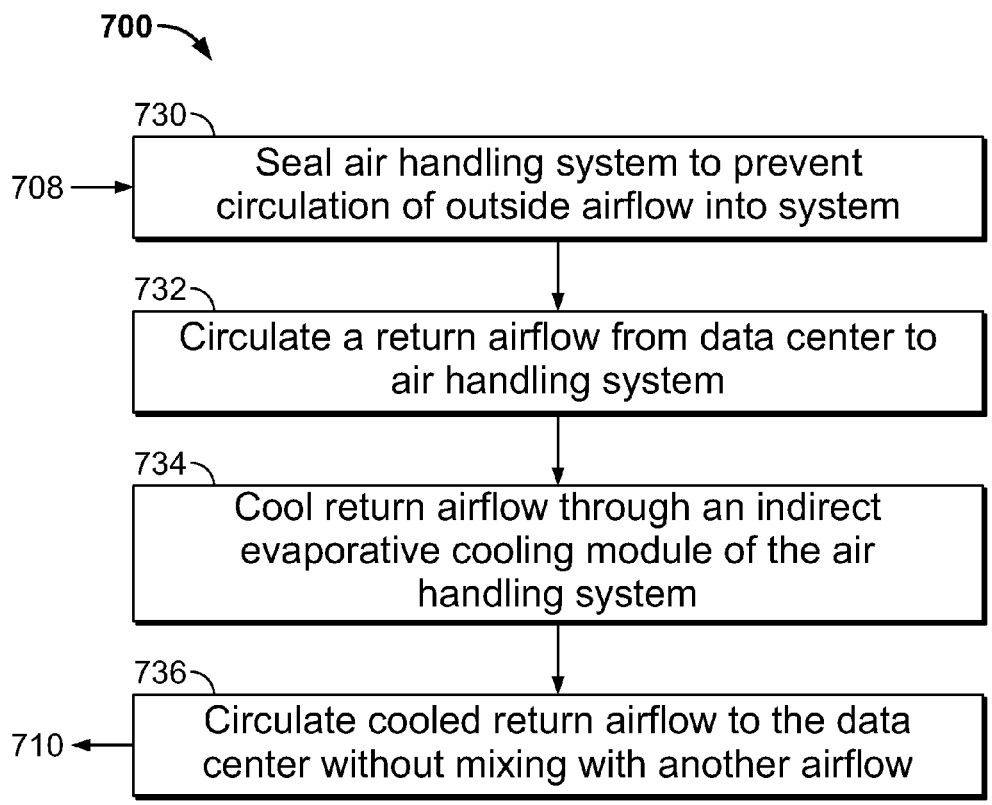

Referring back to FIG. 7A, an indication of a measured contaminant level of the outside air is received (704). It is determined whether the measured contaminant level is higher than a setpoint contaminant level (706). If it is determined that the measured contaminant level is higher than a setpoint contaminant level, the mode of operation is switched from the first mode to a second mode (708). Turning now to FIG. 7C, in the second mode of operation, the air handling system is sealed to prevent circulation of outside airflow into the system (730). For example, any outside air dampers may be moved into a closed position. A return airflow from the data center is circulated to the air handling system (732). The return airflow is cooled though an indirect evaporative cooling module of the air handling system (734). The cooled return airflow is circulated to the datacenter without mixing with other airflows (736).

Figure 7D:
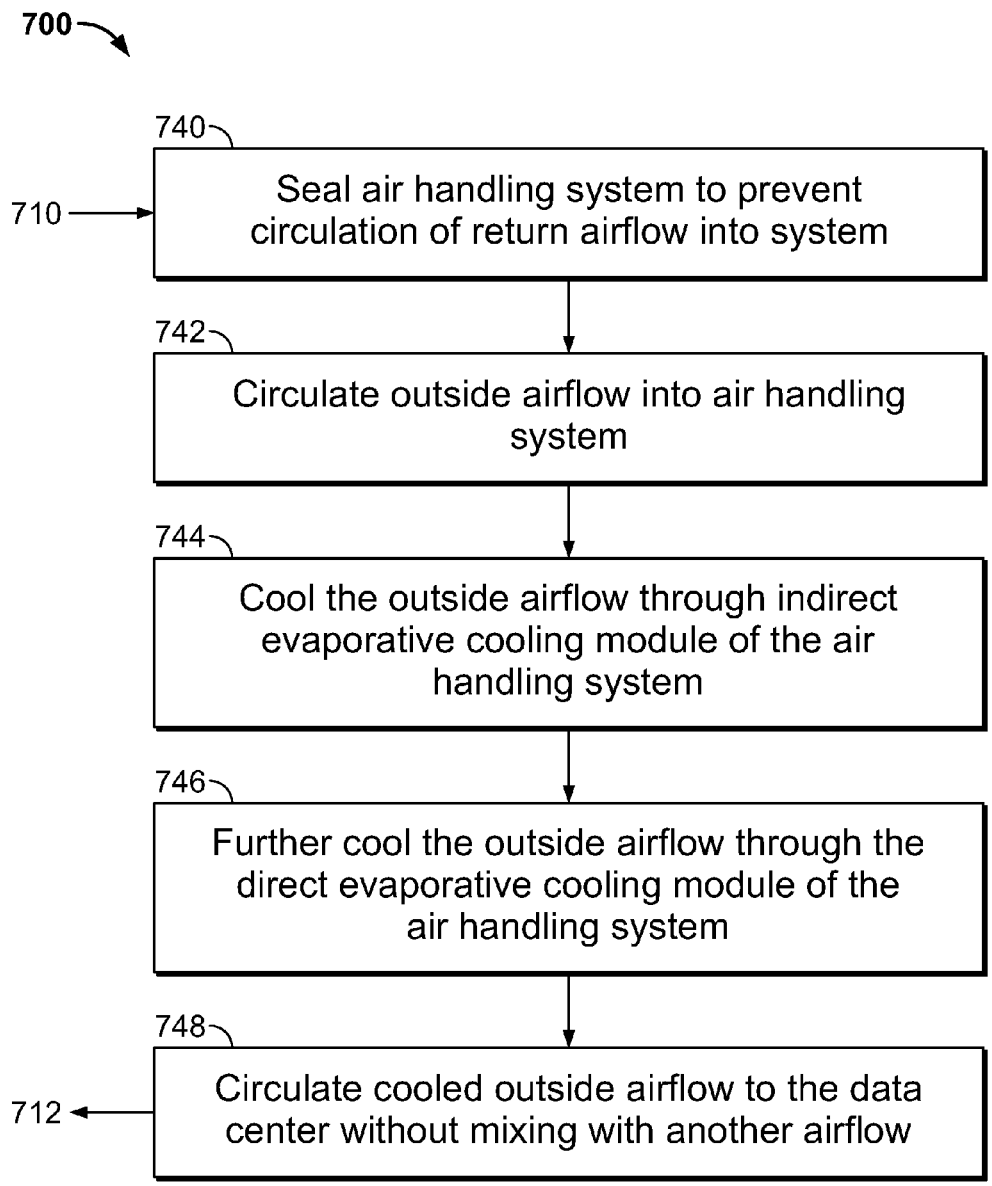

Referring back to FIG. 7A, if it is determined that the measured contaminant level is not higher than the setpoint contaminant level, or in response to implementing the second mode of operation, it is determined whether to switch to a third mode of operation (710). For example, if it is confirmed that outside air is exceptionally warm and dry, it may be determined to switch to the third mode of operation. Turning now to FIG. 7D, in the third mode of operation, the air handling system is sealed to prevent circulation of return airflow into the system (740). For example, any return airflow dampers may be moved into a closed position. An outside airflow is circulated into the air handling system (742). The outside airflow is cooled through an indirect evaporative cooling module of the air handling system (744), and further cooled through a direct evaporative cooling module (756). The cooled outside airflow is circulated to the data center without mixing with other airflows (748).

Figure 7E:
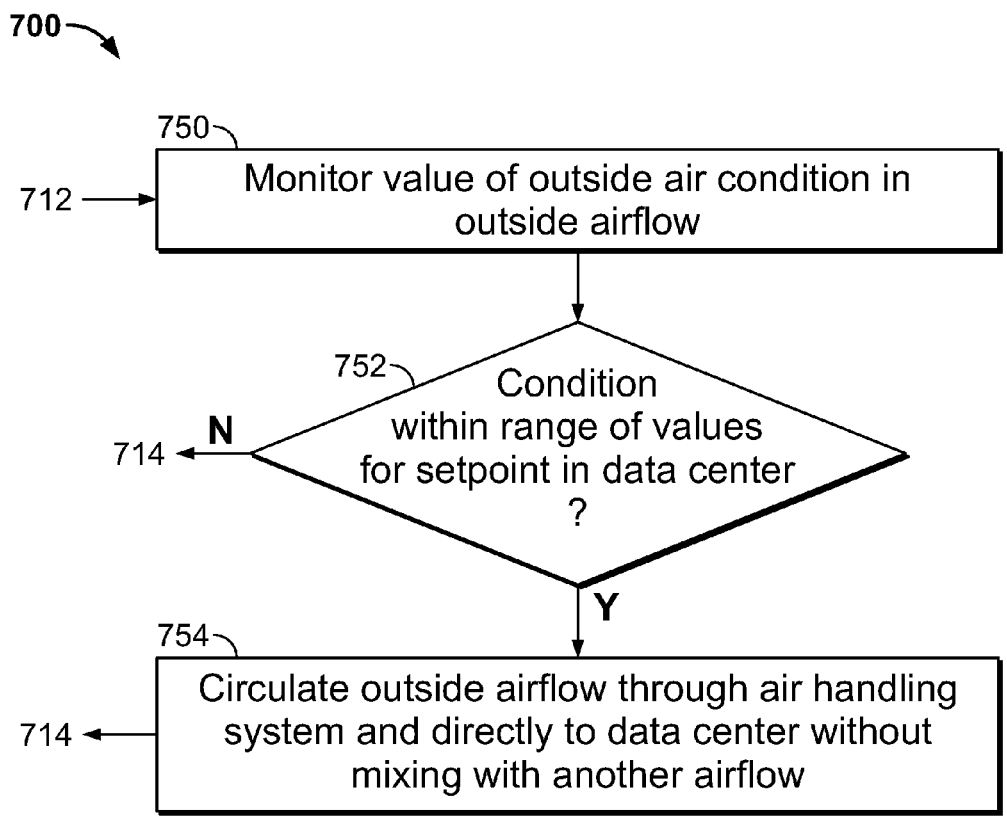

Referring back to FIG. 7A, if it is determined not to switch to the third mode of operation, or in response to implementing the third mode of operation, it is determined whether to switch to a fourth mode of operation (712). Turning now to FIG. 7E, in the fourth mode of operation, a condition value of an outside airflow is monitored (750). For example, the condition value may be an outside dry bulb temperature, an outside wet bulb temperature, an outside enthalpy, an outside relative humidity, or some appropriate combination of such values. It is then determined whether the condition value is within a range of setpoint values for the data center (752) If it is determined that the condition value is within the range of setpoint values, the outside airflow is circulated through the air handling system and directly to the data center without cooling or mixing with other airflows (754).

Figure 7F:
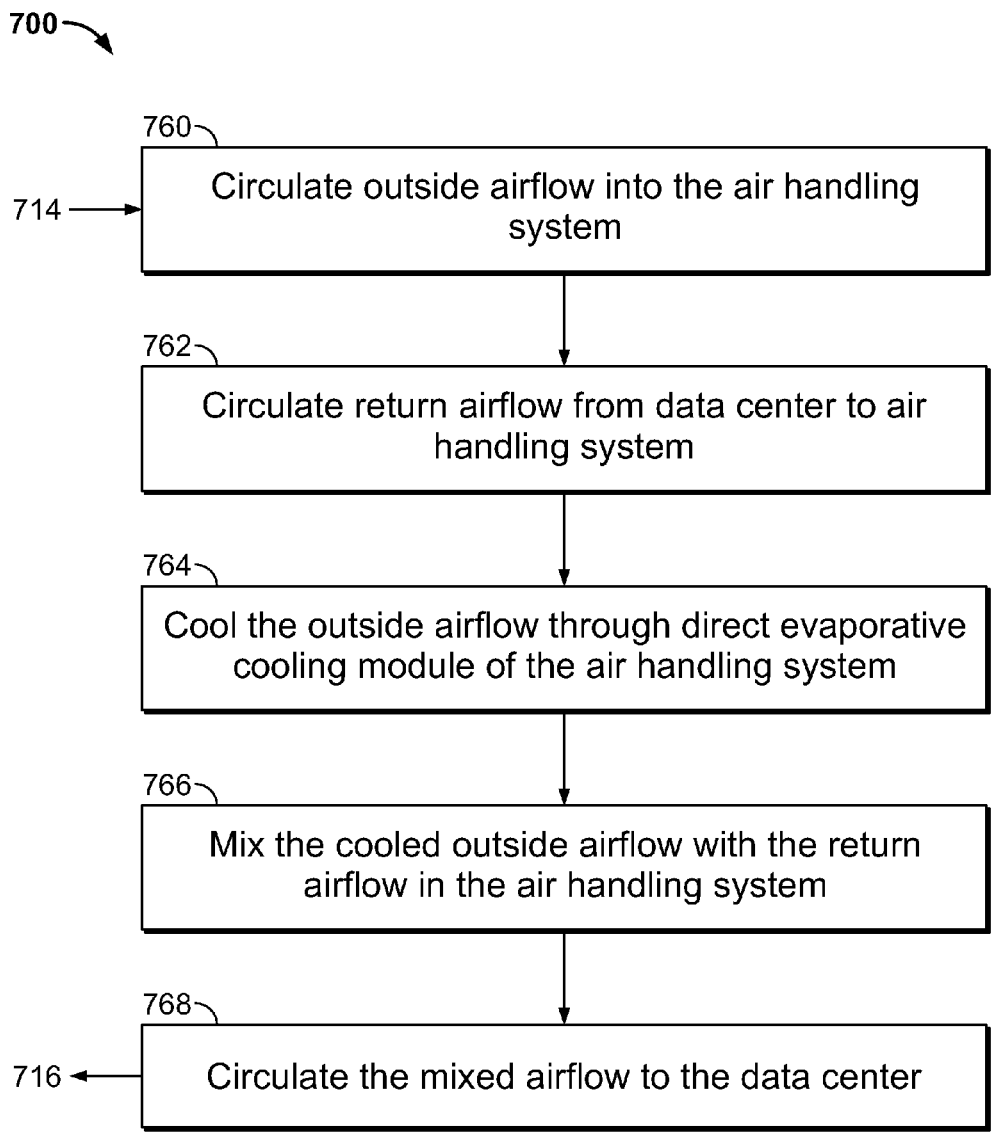

Referring back to FIG. 7A, if it is determined not to switch to the fourth mode of operation, or in response to implementing the fourth mode of operation, it is determined whether to switch to a fifth mode of operation (714). Turning now to FIG. 7F, in the fifth mode of operation, an outside airflow is circulated into the air handling system (760). A return airflow is also circulated into the air handling system (762). The outside airflow can be optionally cooled through a direct evaporative cooling module of the air handling system (764). The outside airflow is mixed with the return airflow in the air handling system (766). For example, if the temperature of the outside air is lower than a temperature setpoint, the warm return airflow can be used to raise the temperature of the supply air. The mixed airflow is circulated to the data center (768). As shown in FIG. 7A, if it is determined not to switch to the fifth mode of operation, the current mode of operation is maintained (716).

As noted above, outside air conditions can be used to determine an appropriate mode of operation for the air handling system. In some implementations, however, other factors such as energy consumption and/or energy efficiency can be considered in determining whether to switch between modes. For example, if it is determined that the outside air contamination level is within an acceptable range (and other air quality conditions have been met), the preferred mode of operation may be the mode expected or predicted to consume the least amount of energy.

Figure 8:
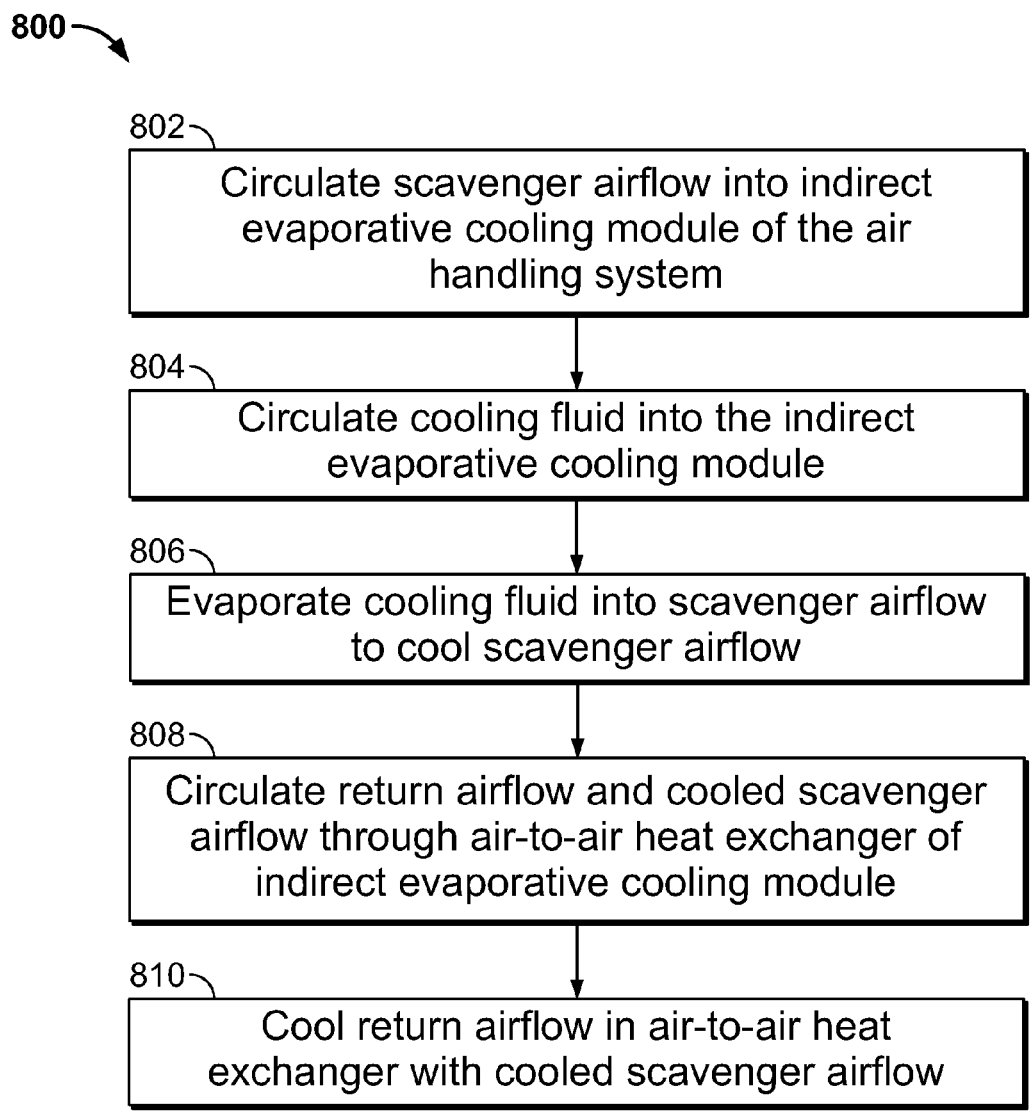
FIG. 8 illustrates an example method for cooling an airflow with an indirect evaporative cooling module in an air handling system.

FIG. 8 illustrates an example method 800 for cooling an airflow with an indirect evaporative cooling module in an air handling system. A scavenger airflow is circulated into an indirect evaporative cooling module of the air handling system (802). A cooling fluid is also circulated into the indirect evaporative cooling module (804). The cooling fluid is evaporated into the scavenger airflow to cool the scavenger airflow (806). For example, using the scavenger airflow to evaporate the cooling fluid may reduce the dry bulb temperature of the scavenger airflow while leaving its wet bulb temperature unchanged. A return airflow from the data center and the scavenger airflow are circulated through an air-to-air heat exchanger of the indirect evaporative cooling module (808). For example, the return airflow may be circulated through a hot side of the heat exchanger, and the scavenger air may be circulated through a cold side. The two airflows may remain separate to inhibit any mixing. The return airflow is cooled in the air-to-air heat exchanger by the cooled scavenger air flow (810).

Figure 9:
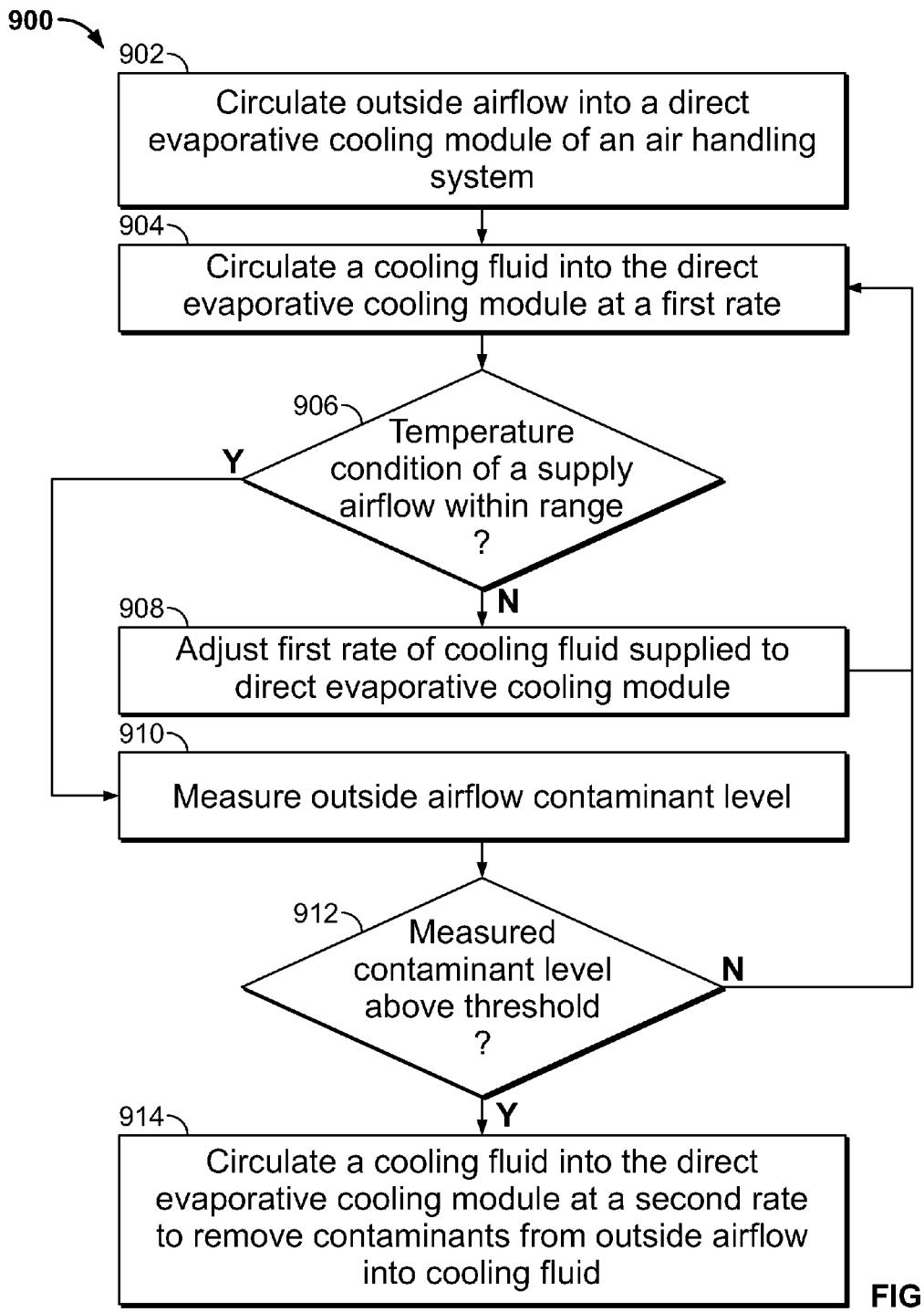
FIG. 9 illustrates an example method for cleaning an airstream through a direct evaporative cooling module in an air handling system.

FIG. 9 illustrates an example method 900 for cleaning an airstream through a direct evaporative cooling module in an air handling system. An outside airflow is circulated into a direct evaporative cooling module of an air handling system (902). A cooling fluid is also circulated into the direct evaporate cooling module, the cooling fluid being circulated at a first flow rate (904). It is then determined whether a temperature condition is within a desired range (906). If it is determined that the temperature condition is not within the desired range, the first flow rate is adjusted (908). For example, the first flow rate can be increased to induce additional cooling of the airflow, or decreased to inhibit over-cooling. If it is determined that the temperature condition is within the desired range, a contaminant level of the outside airflow is measured (910). It is then determined whether the measured contaminant level is above a threshold (912). If it is determined that the contaminant level is not above the threshold, cooling fluid is continuously circulated at the first flow rate. If it is determined that the measured contaminant level is above the threshold, the cooling fluid is circulated into the direct evaporative cooling module at a second rate that is sufficient to remove contaminants (e.g., by precipitating or dissolving contaminant particles) from the outside airflow into the cooling fluid (914).

In some examples, the chemical composition of the cooling fluid can be adjusted in addition to, or in lieu of, the flow rate adjustment to remove contaminants in the outside air. For instance, in response to a determination that the contaminant level is above the threshold, chemical additives can be introduced to the flow of cooling fluid to enhance the scrubbing or filtering effect. The cooling fluid may even be entirely substituted for another type of cooling fluid that offers enhanced scrubbing, for example, if prior adjustments to the flow rate and chemical composition of the cooling fluid have not been sufficient to provide an acceptable contaminant level.

In some implementations, a control loop may also be executed prior to or concurrently with step 914, for example, to control an addition of chemicals to the cooling fluid. For example, if it is determined that the measured contaminant level is above a threshold (912), a pump and/or valve may be adjusted to circulate a chemical (e.g., chlorine dioxide) to mix with the cooling fluid. Such chemicals may, for example, treat (e.g., scrub) the airflow to remove, dissolve, and/or precipitate out particles and contaminants in the airflow. The amount of chemicals may be adjusted so that a predetermined amount is mixed into the cooling fluid, or that chemicals are introduced into the cooling fluid at a set flow rate for a predetermined time period. Alternatively, the amount of chemicals may be proportional to and/or adjusted for a measured amount of contaminants in the outside airflow.

A number of implementations have been described. Nevertheless, it will be understood that various modifications may be made. For example, various combinations of the components described herein may be provided for implementations of similar apparatuses. Also, the methods 700, 800, and 900 illustrated in FIGS. 7A-7F, 8, and 9 may be performed with additional steps or fewer steps than those illustrated. In addition, the order of the steps of methods 700, 800, and 900 may be varied without departing from the scope of this disclosure. Further, one or more steps illustrated in methods 700, 800, and 900 may be performed simultaneously or substantially simultaneously. Accordingly, other implementations are within the scope of the present disclosure.

What is claimed is:

1. A method for treating an outside airflow with a direct evaporative economizer, the method comprising:

circulating an outside airflow from an ambient environment into a first direct evaporative economizer module of an air handling system;

circulating a first portion of a cooling fluid into the first direct evaporative economizer module at a first flow rate, the first flow rate of the cooling fluid selected so that a temperature condition of a supply airflow circulated from the air handling system to a data center meets a predetermined range of setpoint temperatures;

evaporating the first portion of the cooling fluid circulated at the first flow rate into the outside airflow to cool the outside airflow;

circulating the outside airflow to a second direct evaporative economizer module of the air handling system;

determining that a measured air contaminant level of the outside airflow is greater than a setpoint contaminant level of the outside airflow;

based on the determination, circulating a second portion of the cooling fluid into the second direct evaporative economizer module at a second flow rate to precipitate a plurality of contaminants from the outside airflow into the second portion of the cooling fluid, the second flow rate of the cooling fluid selected to precipitate the plurality of contaminants from the outside airflow into the second portion of the cooling fluid and adjust the temperature condition of the supply airflow outside of the predetermined range of setpoint temperatures;

maintaining the second portion of the cooling fluid at the second flow rate based on the measured air contaminant level of the outside airflow being greater than the setpoint contaminant level, with the temperature condition of the supply airflow outside of the predetermined range of setpoint temperatures; and adjusting, during circulation of the second portion of the cooling fluid into the second direct evaporative economizer module at a substantially constant flow rate, at least one of: (i) concentration of a chemical in the second portion of the cooling fluid, or (ii) a chemical composition of the second portion of the cooling fluid based, at least in part, on the measured air contaminant level of the outside airflow greater than a setpoint contaminant level of the outside airflow, wherein the first portion of the cooling fluid is circulated to cool the outside airflow substantially simultaneous with circulation of the second portion of the cooling fluid to precipitate the plurality of contaminants from the outside airflow into the second portion of the cooling fluid.

2. The method of claim 1, further comprising:
monitoring the temperature condition of the supply airflow; and
adjusting the first flow rate of the first portion of the cooling fluid circulated to the first direct evaporative cooling module based on the monitored temperature condition outside of the predetermined range of setpoint temperatures of the supply airflow.

3. The method of claim 1, further comprising circulating the cooling fluid over a media of the first or second direct evaporative economizer module.

4. The method of claim 1, wherein circulating a first portion of a cooling fluid into the first direct evaporative economizer comprises:
atomizing the cooling fluid; and
spraying the atomized cooling fluid into the outside airflow.

5. The method of claim 1, further comprising:
capturing at least a portion of the cooling fluid not evaporated into the outside airflow in a sump of the first or second direct evaporative economizer module;
circulating some of the captured portion of the cooling fluid to a drainage system.

6. The method of claim 5, further comprising:
circulating some of the captured portion of the cooling fluid to a fluid treatment system;
filtering the captured portion of the cooling fluid through the fluid treatment system to remove at least a portion of the precipitated contaminants; and
recirculating the filtered cooling fluid back to the first or second direct evaporative economizer module.

7. The method of claim 1, wherein the cooling fluid comprises:
deionized water; or
reverse osmosis water.

8. The method of claim 7, wherein the cooling fluid further comprises chlorine dioxide.

9. An air handling system, comprising:
an outside air plenum;
a supply fan in airflow communication with the outside air plenum;
a first direct evaporative economizer module and a second direct evaporative economizer module arranged in fluid communication with the outside air plenum and the supply fan, each of the first and second direct evaporative economizer modules comprising:
an airflow path; and
at least one nozzle arranged in the airflow path and configured to release a cooling fluid into an outside airflow in the airflow path;
at least one pump configured to supply the cooling fluid to the nozzles of the first and second direct evaporative economizer modules; and
a control system configured to control the pump to:
release a first portion of the cooling fluid through the nozzle of the first direct evaporative economizer module into the outside airflow at a first flow rate to meet a predetermined range of setpoint temperatures of a supply airflow circulated from the supply fan,
release, substantially simultaneously with release of the first portion of the cooling fluid through the nozzle of the first direct evaporative economizer, a second portion of the cooling fluid through the nozzle of the second direct evaporative economizer module into the outside airflow at a second flow rate based on a measured air contaminant level of the outside airflow greater than a setpoint contaminant level of the outside airflow, where the outside airflow temperature is outside of the predetermined range of setpoint temperatures when the cooling fluid is released into the outside airflow at the second flow rate,
maintain the second portion of the cooling fluid at the second flow rate through the nozzle of the second direct evaporative economizer module based on the measured air contaminant level of the outside airflow being greater than the setpoint contaminant level, with the temperature condition of the supply airflow outside of the predetermined range of setpoint temperatures, and
adjust, during release of the second portion of the cooling fluid through the nozzle of the second direct evaporative economizer module at a substantially constant second flow rate, at least one of: (i) concentration of a chemical in the second portion of the cooling fluid, or (ii) a chemical composition of the second portion of the cooling fluid based, at least in part, on the measured air contaminant level of the outside airflow greater than a setpoint contaminant level of the outside airflow.

10. The system of claim 9, wherein the control system is further configured to:
monitor a condition of the supply airflow; and
control the pump to adjust the first flow rate of the first portion of the cooling fluid released into the outside airflow based on the monitored condition outside of the predetermined range of setpoint temperatures of the supply airflow.

11. The system of claim 9, wherein the control system is further configured to control the pump to circulate the cooling fluid over a media of the direct evaporative economizer module.

12. The system of claim 9, wherein the at least one nozzle is further configured to:
atomize the cooling fluid; and
spray the atomized cooling fluid into the outside airflow in the airflow path.

13. The system of claim 9, wherein at least one of the first or second direct evaporative economizer modules further comprises:
a sump positioned to capture at least a portion of the cooling fluid not evaporated into the outside airflow;

a second pump configured to circulate some of the captured portion of the cooling fluid to a drainage system.

14. The system of claim 13, wherein the second pump is configured to:
   circulate some of the captured portion of the cooling fluid to a fluid treatment system to be filtered to remove at least a portion of precipitated contaminants contained in the cooling fluid; and
   recirculate the filtered cooling fluid back to at least one of the first or second direct evaporative economizer modules.

15. The system of claim 9, wherein the cooling fluid comprises:
   deionized water; or
   reverse osmosis water.

16. The system of claim 15, wherein the cooling fluid further comprises chlorine dioxide.

17. A direct evaporative economizer apparatus for an air handling system, comprising:
   an inlet in airflow communication with an outside air plenum;
   an outlet in airflow communication with a supply fan;
   an airflow path defined between the inlet and the outlet;
   a first conduit arranged adjacent the airflow path to release a first portion of cooling fluid into an airflow in the airflow path;
   a second conduit arranged adjacent the airflow path to release a second portion of cooling fluid into the airflow in the airflow path; and
   a control system configured to control the release of the first portion of cooling fluid into the airflow at a first flow rate to meet a predetermined range of setpoint temperatures of a supply airflow circulated from the outlet, the control system further configured to control, substantially simultaneously with release of the first portion of the cooling fluid into the airflow, the release of the second portion of cooling fluid into the airflow at a second flow rate based on a measured air contaminant level of the airflow greater than a setpoint contaminant level of the airflow, where the airflow temperature is outside of the predetermined range of setpoint temperatures when the second portion of cooling fluid is released into the airflow at the second flow rate, the control system is further configured to maintain the second portion of cooling fluid at the second flow rate based on the measured air contaminant level of the airflow being greater than the setpoint contaminant level, with the temperature condition of the supply airflow outside of the predetermined range of setpoint temperatures, and adjust, during release of the second portion of the cooling fluid into the airflow at a substantially constant flow rate, at least one of: (i) concentration of a chemical in the second portion of the cooling fluid, or (ii) a chemical composition of the second portion of the cooling fluid based, at least in part, on the measured air contaminant level of the airflow greater than a setpoint contaminant level of the airflow.

18. The apparatus of claim 17, wherein the control system is further configured to:
   monitor a temperature condition of the supply airflow; and
   control a pump configured to circulate the first portion of cooling fluid to the first conduit to adjust the first flow rate of cooling fluid released into the airflow based on the monitored temperature condition outside of the predetermined range of setpoint temperatures of the supply airflow.

19. The apparatus of claim 17, wherein the control system is further configured to control the pump to circulate the cooling fluid over a media of the direct evaporative economizer apparatus.

20. The apparatus of claim 17, wherein at least one of the first or second conduits comprises a mister configured to:
   atomize the cooling fluid; and
   spray the atomized cooling fluid into the airflow in the airflow path.

21. The apparatus of claim 17, further comprising:
   a sump positioned to capture at least a portion of the second portion of cooling fluid not evaporated into the airflow; and
   a pump configured to circulate some of the captured portion of the cooling fluid to a drainage system.

22. The apparatus of claim 21, wherein the pump is configured to:
   circulate some of the captured portion of the cooling fluid to a fluid treatment system to be filtered to remove at least a portion of precipitated contaminants contained in the cooling fluid; and
   recirculate the filtered cooling fluid back to the second conduit.

23. The apparatus of claim 17, wherein the cooling fluid comprises:
   deionized water; or
   reverse osmosis water.

24. The apparatus of claim 23, wherein the cooling fluid further comprises chlorine dioxide.

25. The apparatus of claim 17, further comprising a wettable media arranged in the airflow path between the inlet and the outlet, wherein at least one of the first or second conduits is positioned in the airflow path to release the cooling fluid over at least a portion of the wettable media.

26. The method of claim 1, further comprising:
   capturing at least a portion of the plurality of contaminants in the outside airflow with the adjusted second portion of the cooling fluid.

27. A method for treating an outside airflow with a direct evaporative economizer, the method comprising:
   circulating an outside airflow from an ambient environment into a first direct evaporative economizer module of an air handling system;
   circulating a first portion of a cooling fluid into the first direct evaporative economizer module at a first flow rate, the first flow rate of the cooling fluid selected so that a temperature condition of a supply airflow circulated from the air handling system to a data center meets a predetermined range of setpoint temperatures;
   evaporating the first portion of the cooling fluid circulated at the first flow rate into the outside airflow to cool the outside airflow;
   circulating the outside airflow to a second direct evaporative economizer module of the air handling system;
   determining that a measured air contaminant level of the outside airflow is greater than a setpoint contaminant level of the outside airflow;
   based on the determination, circulating a second portion of the cooling fluid into the second direct evaporative economizer module at a second flow rate to precipitate a plurality of contaminants from the outside airflow into the second portion of the cooling fluid, the second flow rate of the cooling fluid selected to precipitate the plurality of contaminants from the outside airflow into the second portion of the cooling fluid; and
   adjusting, during circulation of the second portion of the cooling fluid into the second direct evaporative economizer module at a substantially constant flow rate, at least one of: (i) concentration of a chemical in the second portion of the cooling fluid, or (ii) a chemical composition of the second portion of the cooling fluid based, at least in part, on the measured air contaminant level of the outside airflow greater than a setpoint contaminant level of the outside airflow.

* * * * *